(12) United States Patent
Kurihara et al.

(10) Patent No.: US 9,225,928 B2
(45) Date of Patent: Dec. 29, 2015

(54) LASER DRIVING CIRCUIT, LASER DRIVING METHOD, PROJECTOR APPARATUS AND APPARATUS WHICH USES LASER LIGHT

(71) Applicant: Sony Corporation, Tokyo (JP)

(72) Inventors: Tsutomu Kurihara, Tokyo (JP); Motoi Kimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 196 days.

(21) Appl. No.: 13/785,792

(22) Filed: Mar. 5, 2013

(65) Prior Publication Data

US 2013/0258210 A1    Oct. 3, 2013

(30) Foreign Application Priority Data

Mar. 30, 2012   (JP) ................................. 2012-078918

(51) Int. Cl.
| | |
|---|---|
| H01S 3/00 | (2006.01) |
| H04N 5/74 | (2006.01) |
| H04N 9/31 | (2006.01) |
| H01S 5/042 | (2006.01) |
| H01S 5/026 | (2006.01) |

(52) U.S. Cl.
CPC ................ *H04N 5/74* (2013.01); *H01S 5/0261* (2013.01); *H01S 5/042* (2013.01); *H04N 9/3129* (2013.01); *H04N 9/3155* (2013.01); *H04N 9/3161* (2013.01)

(58) Field of Classification Search
CPC . H01S 5/005; H01S 5/02216; H01S 5/02252; H01S 5/02272; H01S 5/02284; H01S 5/02415; H01S 5/06226; H01S 5/0683

USPC ........................................................ 372/38.02
See application file for complete search history.

(56) References Cited

U.S. PATENT DOCUMENTS

| | | | |
|---|---|---|---|
| 7,120,180 B2* | 10/2006 | Shibuya ....................... 372/38.1 |
| 2010/0027390 A1* | 2/2010 | Kikugawa ................... 369/47.28 |
| 2011/0291725 A1* | 12/2011 | Shin ............................... 327/175 |
| 2012/0001961 A1* | 1/2012 | Nishikawa et al. ........... 345/690 |
| 2012/0140784 A1* | 6/2012 | Quirk et al. .............. 372/29.015 |

FOREIGN PATENT DOCUMENTS

| | | |
|---|---|---|
| JP | H05-291661 | 11/1993 |
| JP | 2005-340278 A | 12/2005 |

(Continued)

OTHER PUBLICATIONS

Japanese Office Action issued Nov. 4, 2015 for corresponding Japanese Application No. 2012-078918.

*Primary Examiner* — Tod T Van Roy
*Assistant Examiner* — Vu A Vu
(74) *Attorney, Agent, or Firm* — Michael Best & Friedrich LLP

(57) ABSTRACT

Disclosed herein is a laser driving circuit, including: a plurality of laser driving video current generation circuits configured to generate a plurality of kinds of laser driving current for driving a plurality of laser light sources configured to emit laser light having wavelengths different from each other based on an inputted video signal; a high frequency superposition section configured to superpose a high frequency signal having a frequency higher than a frequency band of the video signal on the laser driving current generated by the laser driving video current generation circuits; and a waveform correction section configured to correct a waveform of the high frequency signal.

18 Claims, 34 Drawing Sheets

(56) References Cited

FOREIGN PATENT DOCUMENTS

| JP | 2008-103515 A | 5/2008 |
| JP | 2009-122552 A | 6/2009 |
| JP | 2010-066303 | 3/2010 |
| JP | 2011-508982 A | 3/2011 |

* cited by examiner

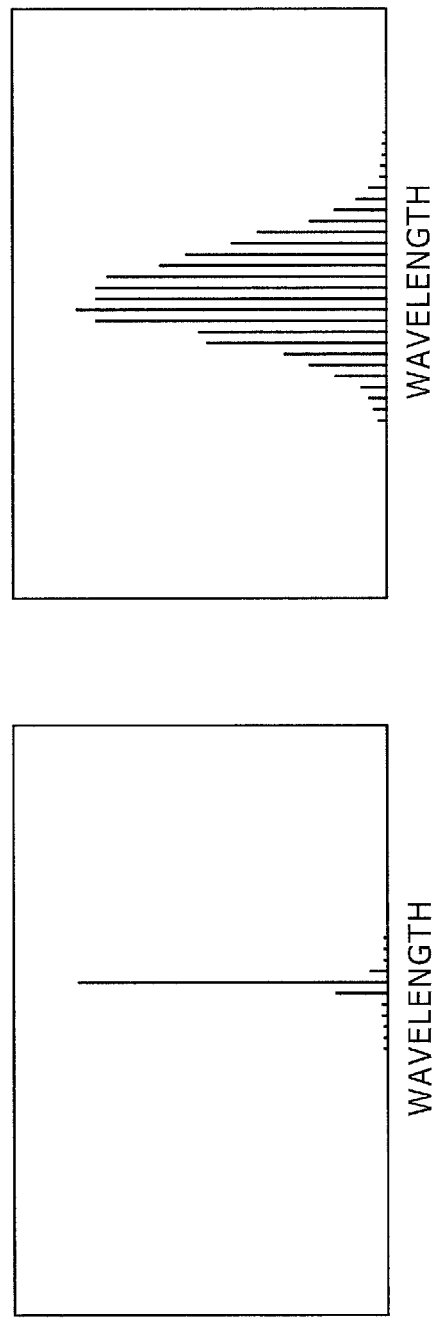

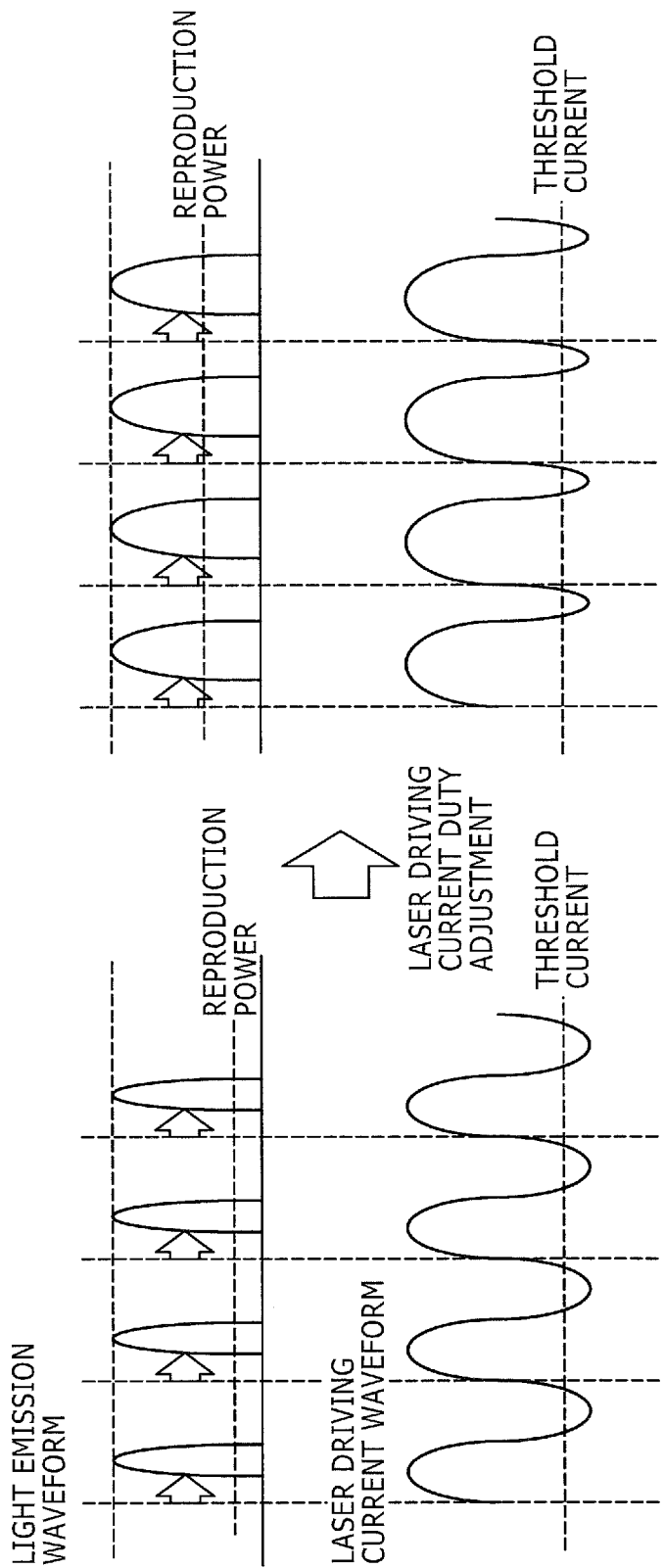

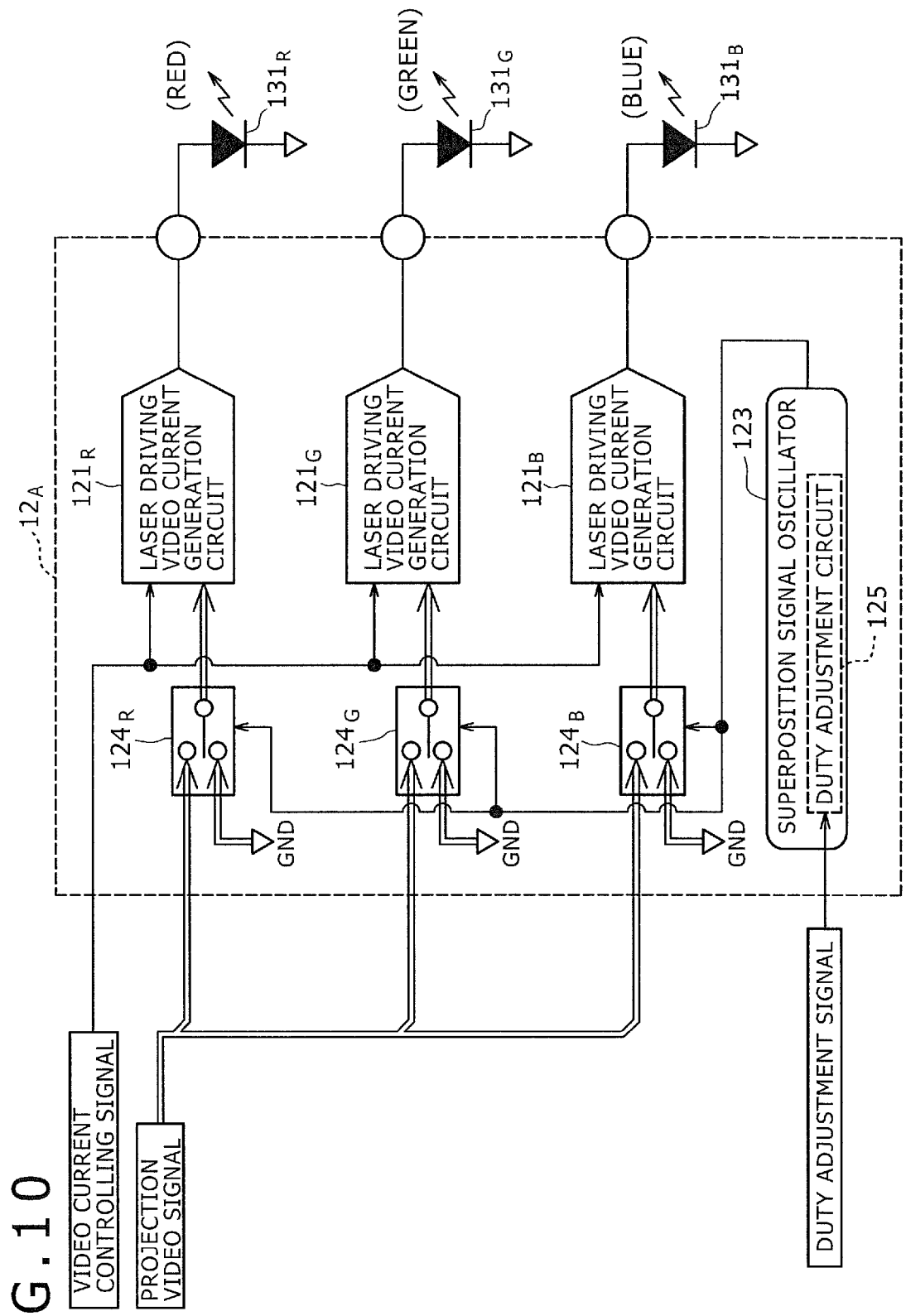

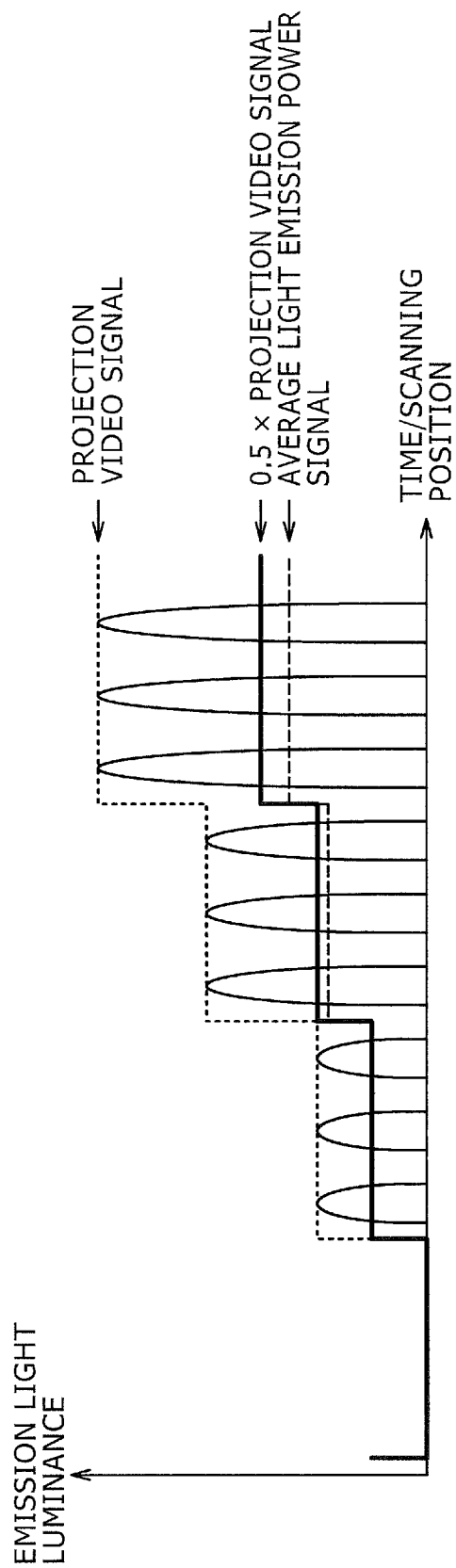

LASER DRIVING CIRCUIT, LASER DRIVING METHOD, PROJECTOR APPARATUS AND APPARATUS WHICH USES LASER LIGHT

BACKGROUND

The present disclosure relates to a laser driving circuit, a laser driving method, a projector apparatus and an apparatus which uses laser light, namely, a laser beam.

As an apparatus which uses laser light, namely, a laser beam, for example, a laser display apparatus which uses laser light to display an image is available. In this laser display apparatus, a laser light source for emitting laser light is driven by a laser driving circuit, and the laser light is scanned by a scanner under the driving by the laser driving circuit to display an image on a screen. A laser display apparatus of the type just described is disclosed, for example, in Japanese Patent Laid-Open No. 2010-66303.

SUMMARY

In a laser display apparatus, the optical path length of laser light after it is emitted from a laser light source until it comes through a screen to the eye of a viewer to form an image varies at random by minute irregularities of the screen. Then, in the case of coherent light which is uniform in wavelength and phase like laser light, light rays of different phases enter the eye in response to a variation in optical path length and interfere with each other to produce speckle noise by which innumerable interference fringes wherein the intensity is distributed at random appear. This speckle noise is a problem which arises not only with a laser display apparatus but also with a general apparatus which uses laser light which is coherent light.

Therefore, it is desirable to provide a laser driving circuit, a laser driving method, a projector apparatus and an apparatus which uses laser light by which speckle noise arising from the fact that the laser light is coherent light can be reduced.

According to an embodiment of the technology of the present disclosure, there is provided a laser driving circuit including a plurality of laser driving video current generation circuits configured to generate a plurality of kinds of laser driving current for driving a plurality of laser light sources for emitting laser light having wavelengths different from each other based on an inputted video signal, a high frequency superposition section configured to superpose a high frequency signal having a frequency higher than a frequency band of the video signal on the laser driving current generated by the laser driving video current generation circuits, and a waveform correction section configured to correct a waveform of the high frequency signal.

According to another embodiment of the technology of the present disclosure, there is provided a laser driving method including generating a plurality of kinds of laser driving current for driving a plurality of laser light sources for emitting laser light having wavelengths different from each other based on an inputted video signal, superposing a high frequency signal having a frequency higher than a frequency band of the video signal on the laser driving current generated by the laser driving current generation, and correcting a waveform of the high frequency signal.

By superposition of a high frequency signal on laser driving current based on a video signal and driving the laser light source with the laser driving current on which the high frequency signal is superposed, the waveform spectrum of laser light to be emitted from the laser light sources is expanded. Consequently, the coherence of the laser light decreases. As the coherence of the laser light decreases, speckle noise arising from the fact that the laser light is coherent light can be reduced. Further, by correcting the waveform of the high frequency signal to be superposed on the laser driving current, the emission light waveform of the laser light sources can be adjusted.

With the present disclosure, by correction of the waveform of the high frequency signal, the emission light waveform of the laser light sources can be maintained in a good state while speckle noise arising from the fact that the laser light is coherent light can be reduced.

The above and other objects, features and advantages of the present technology will become apparent from the following description and the appended claims, taken in conjunction with the accompanying drawings in which like parts or elements denoted by like reference symbols.

BRIEF DESCRIPTION OF THE DRAWINGS

FIGS. 8A and 8B are diagrams illustrating a change of a wavelength spectrum of laser output light by superposition of a high frequency signal with laser driving current;

FIG. 9 is a waveform diagram illustrating an example of laser emitted light delay when a high frequency signal is superposed on laser driving current;

FIG. 10 is a block diagram showing a configuration of a laser driving circuit according to a working example of a first embodiment;

FIG. 34 is a waveform illustrating comparison between an average emission light power signal generated by the laser driving circuit of FIG. 32 and a projection video signal.

DETAILED DESCRIPTION OF THE PREFERRED EMBODIMENTS

Figure 1:
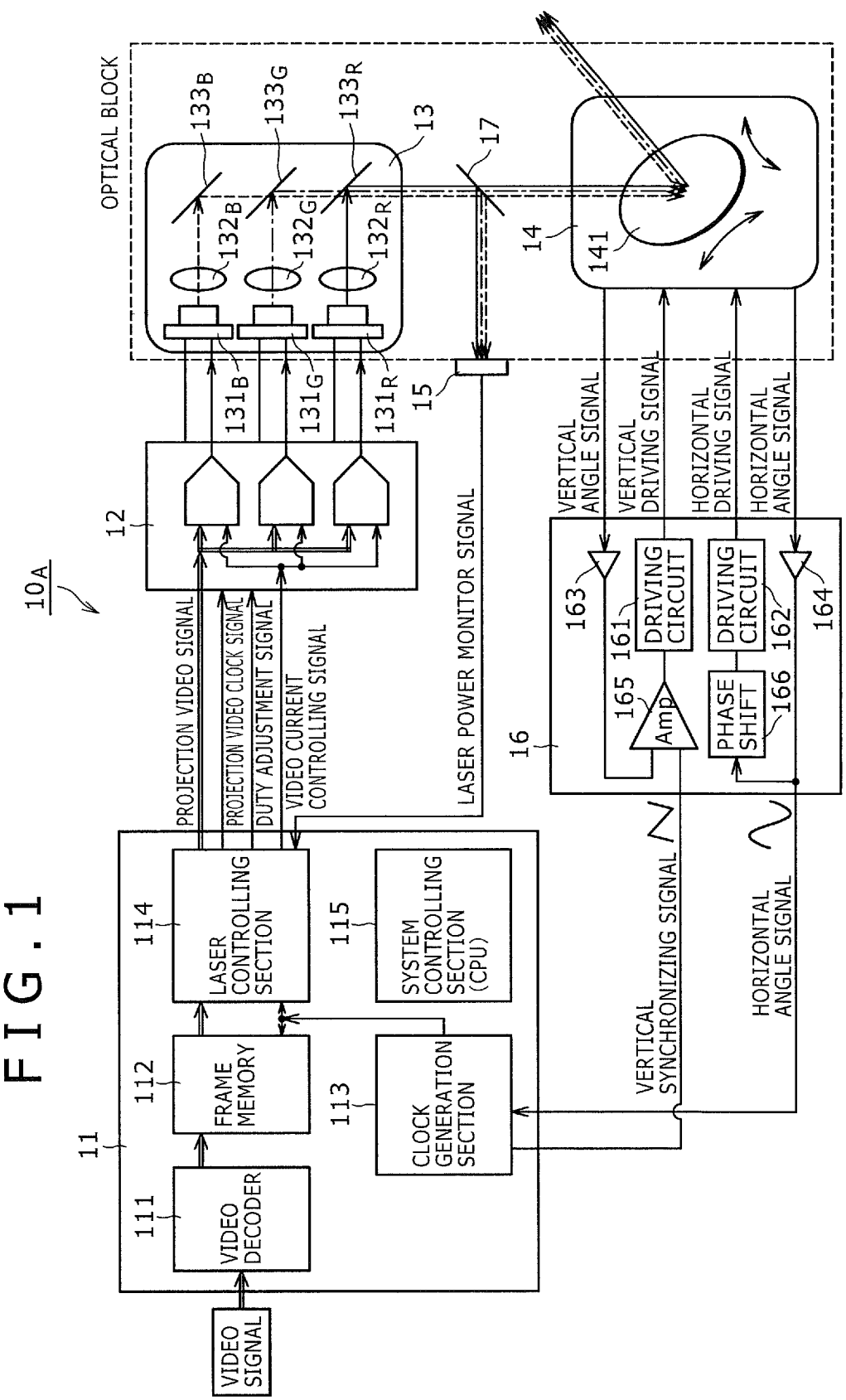
FIG. 1 is a system block diagram showing an example of a configuration of a projector apparatus of the laser beam scanning type according to a first embodiment of the present disclosure.

In the following, preferred embodiments of the technology of the present disclosure are described in detail with reference to the accompanying drawings. The present disclosure is not limited to the embodiments, and various numerical values and so forth in the embodiments are illustrative. In the following description, like elements or elements having like functions are denoted by like reference characters and overlapping description of such elements is omitted. It is to be noted that the description is given in the following order.

1. General Description of the Laser Driving Circuit, Laser Driving Method, Projector Apparatus and Apparatus Which Uses Laser light According to the Present Disclosure
2. First Embodiment
   2-1. Basic Configuration of the Laser Driving Circuit
   2-2. Working Example 1
   2-3. Modification to the Working Example 1
   2-4. Working Example 2
   2-5. Working Example 3
   2-6. Working Example 4
   2-7. Application Example
3. Second Embodiment
   3-1. Working Example 1
   3-2. Application Example
4. Configuration of the Present Disclosure <1. General Description of the Laser Driving Circuit, Laser Driving Method, Projector Apparatus and Apparatus Which Uses Laser light According to the Present Disclosure>

The laser driving circuit of the present disclosure is used to drive a plurality of laser light sources which emit laser light, namely, laser beams, of different wavelengths. As the laser light sources, for example, three RGB laser light sources for emitting laser beams of three different wavelengths of red (R), green (G) and blue (B) can be used. For the laser light sources, preferably a semiconductor laser which is smaller in size and higher in efficiency than the other light sources is used. However, the semiconductor laser is an example, and the laser light source is not limited to the semiconductor laser.

The laser driving circuit of the present disclosure receives a video signal as an input thereto and amplifies the video signal to generate laser driving current for driving the laser light sources. In order to generate the laser driving current, the technology of the present disclosure relates to a laser driving circuit and a laser driving method which use a technique for high frequency superposition wherein a high frequency signal of a frequency higher than the frequency band of the video signal is superposed on the laser driving current. The laser driving circuit and the laser driving method of the present disclosure in which the technique for high frequency superposition is used can be applied to general apparatus which use laser light.

As an apparatus which uses laser light, particularly as an apparatus which uses the laser driving circuit and the laser driving method of the present disclosure, a projector apparatus of the laser beam scanning type which is a kind of a laser display apparatus can be listed. However, the application of the technology of the present disclosure is not limited to that to the projector apparatus, but the technology of the present disclosure can be applied to general apparatus which use laser light. As a laser display apparatus other than the projector apparatus, a head-mounted display unit, a laser liquid crystal TV (television) set, an organic laser TV set, a stereoscopic or three-dimensional display unit and so forth can be listed.

The laser driving circuit of the present disclosure includes a plurality of laser driving video current generation circuits which generate laser driving current for driving a plurality of laser light sources, which emit laser beams of different wavelengths, based on a video signal inputted thereto. The laser driving circuit of the present disclosure further includes a high frequency superposition section configured to superpose a high frequency signal of a frequency higher than the frequency band of the video signal on the laser driving current generated by the laser driving video current generation circuits.

By superposing the high frequency signal on the laser driving current based on the video signal in this manner and driving the laser light sources with the laser driving current generated by the laser driving video current generation circuits, the wavelength spectrum of the laser light to be emitted from the laser light sources is expanded. Consequently, the coherence of the laser light drops. As a result of the drop of the coherence of the laser light, speckle noise arising from the fact that the laser light is coherent light can be reduced.

The laser driving circuit of the present disclosure includes a waveform correction section configured to correct the waveform of the high frequency signal in order to maintain the emission light waveform of the laser light sources in a good state. By correcting the waveform of the high frequency signal to be superposed on the laser driving current in this manner, the emission light waveform of the laser light sources can be adjusted. As a result, by the correction of the waveform of the high frequency signal, speckle noise can be reduced while the emission light waveform of the laser light sources is maintained in a good state.

In the laser driving circuit, laser driving method and apparatus which uses laser light of the present disclosure including the preferred configurations described above, the waveform correction section can be configured such that it is configured from a duty adjustment circuit for adjusting the duty of the high frequency signal. In this instance, preferably the duty adjustment is carried out within a range within which the amplitude of the high frequency signal cross threshold current of the laser light sources.

Further, in the laser driving circuit, laser driving method and apparatus which uses laser light of the present disclosure including the preferred configurations described above, the high frequency superposition section can be configured such that an oscillator configured to oscillate the high frequency signal is built in the high frequency superposition section. In this instance, preferably the duty adjustment circuit is configured so as to adjust the duty of the high frequency signal to be oscillated by the oscillator.

Or, in the laser driving circuit, laser driving method and apparatus which uses laser light of the present disclosure including the preferred configurations described above, the high frequency superposition section can be configured such that it includes, as the signal source of the high frequency signal, a receiver which receives a clock signal inputted in a synchronized state with the inputted video signal from the outside. At this time, the duty adjustment circuit can be configured such that it adjusts the duty of the high frequency signal based on the clock signal received by the receiver.

Or, in the laser driving circuit, laser driving method and apparatus which uses laser light of the present disclosure including the preferred configurations described above, the waveform correction section can be configured such that it includes a plurality of phase and duty adjustment circuits configured to generate a plurality of high frequency signals whose phases and duties are different from each other. At this time, the high frequency superposition section can be configured such that it generates multilevel laser driving current within a superposition oscillation period based on the high frequency signals.

Or, the high frequency superposition section can be configured such that it has a plurality of switches configured to change over a signal having luminance information and controls the switches in response to the high frequency signals to select a plurality of pieces of luminance information having levels different from each other to generate the multilevel laser driving current.

Or else, in the laser driving circuit, laser driving method and apparatus which uses laser light of the present disclosure including the preferred configurations described above, the high frequency superposition section can be configured such that it includes an amplifier/attenuator configured to amplify/attenuate the video signal inputted for each waveform. In this instance, the high frequency superposition section can be configured such that it controls the gain of the amplifier/attenuator in response to an adjustment value of the duty by the duty adjustment circuit.

Or otherwise, in the laser driving circuit, laser driving method and apparatus which uses laser light of the present disclosure including the preferred configurations described above, the high frequency superposition section can be configured such that it adjusts the duty of the laser driving current in response to a monitor signal of emission light power of the laser light sources.

At this time, the high frequency superposition section can be configured such that it includes an amplifier/attenuator configured to amplify/attenuate the inputted video signal and a comparator configured to compare a monitor signal of emission light power of the laser light source and the video signal after passing the amplifier/attenuator with each other. Then, the duty adjustment circuit can be configured such that it adjusts the duty of the laser driving current in response to a result of the comparison by the comparator. Further, the high frequency superposition section can be configured such that it includes a low-pass filter configured to remove a high frequency component of the monitor signal of the emission light power of the laser light source.

<2. First Embodiment>

As the apparatus of the present disclosure which uses laser light, a projector apparatus, more particularly, a projector apparatus of the laser beam scanning type, is exemplified. A system configuration of the projector apparatus according to the first embodiment is described below.

System Configuration of the Projector Apparatus According to the First Embodiment FIG. 1 is a system block diagram showing an example of a configuration of the projector apparatus of the laser beam scanning type according to the first embodiment. The projector apparatus $10_A$ according to the present embodiment is configured such that it includes a video signal processing circuit 11, a laser driving circuit 12, a clock generation section 13, a scanner section 14, a light reception element 15 and a scanner driving circuit 16.

The video signal processing circuit 11 includes a video decoder 111, a frame memory 112, a clock generation section 113, a laser controlling section 114 and a system controlling section 115. The video signal processing circuit 11 generates a video signal in accordance with characteristics of laser light such as a wavelength in synchronism with a scanning operation of the scanner section 14 from a video signal inputted thereto. Such a video signal for driving a laser as just described is hereinafter referred to as "projection video signal."

The video signal processing circuit 11 is described more particularly. In the video signal processing circuit 11, the video decoder 111 converts a video signal inputted thereto into a video signal corresponding to the wavelength of each light source of the clock generation section 13, namely, carries out color gamut conversion of the inputted video signal. The frame memory 112 stores the video signals after the color gamut conversion provided thereto from the video decoder 111 once. The clock generation section 113 generates a projection video clock signal synchronized with a scanning operation of the scanner section 14. The projection video clock signal is supplied to the frame memory 112 and the laser controlling section 114.

The frame memory 112 receives the projection video signal to read out a stored video signal in synchronism with the projection video clock signal. Consequently, the video signal read out from the frame memory 112 is kept in synchronism with the scanning operation of the scanner section 14.

The laser controlling section 114 monitors the emission light power of each light source of the clock generation section 13 based on a laser power monitor signal supplied thereto from the light reception element 15 to generate a projection video signal by which laser light is emitted in accordance with the inputted video signal. The laser controlling section 114 further discriminates, from the laser power monitor signal, an optimum duty of the waveform of a high frequency superposition signal hereinafter described, namely, of a high frequency signal to be superposed on laser driving current. Then, the laser controlling section 114 generates a duty adjustment signal for adjusting the duty so as to become the optimum duty. The system controlling section 115 is configured from a CPU and so forth and controls the entire system.

The projection video signal generated by the laser controlling section 114 is supplied to the laser driving circuit 12 together with the duty adjustment signal and a video current controlling signal hereinafter described. In addition to the projection video signal and the video current controlling signal, a pixel period synchronizing signal indicative of a start of a pixel is supplied to the laser driving circuit 12 from the video signal processing circuit 11 together with the projection video clock signal generated by the clock generation section 113.

The laser driving circuit 12 drives each light source of the clock generation section 13 in accordance with a projection video signal corresponding to each wavelength. This laser driving circuit 12 is a characteristic component of the present disclosure, and a basic configuration and particular working examples of the laser driving circuit 12 are hereinafter described.

The clock generation section 13 includes a plurality of light sources, for example, three light sources. As those light sources, for example, laser light sources $131_R$, $131_G$ and $131_B$ for emitting laser light of wavelengths of red (R), green (G) and blue (B) are used. In FIG. 1, a laser beam of red is indicated by a solid line, a laser beam of green by an alternate long and short dash line, and a laser beam of blue by a broken line for the convenience of illustration. As the laser light sources $131_R$, $131_G$ and $131_B$, preferably a semiconductor laser which particularly is small in size and high in efficiency is used.

The emitted light beams of the laser light sources $131_R$, $131_G$ and $131_B$ are modulated with projection video signals corresponding to the individual wavelengths. In particular, in order to display an image corresponding to an inputted video signal, the luminance, namely, the tone, of the laser light is controlled, and in order to implement a gradation representation, the intensity of the laser light is modulated. The laser beams emitted from the laser light sources $131_R$, $131_G$ and $131_E$ are converted into substantially parallel beams by the collimate lenses $132_3$, $132_G$ and $132_B$ and then bundled into a single laser beam by the beam splitters $133_R$, $133_G$ and $133_E$ and so forth.

The bundled single laser beam is partly reflected by a beam splitter 17 disposed intermediately of the optical path to the scanner section 14. The reflected laser beam is introduced into the light reception element 15. The light reception element 15 outputs, based on the laser light inputted thereto, a laser power monitor signal indicative of the emission light powers of the laser light sources $131_R$, $131_G$ and $131_B$ of the clock generation section 13 and supplies a laser power monitor signal to the laser controlling section 114 of the video signal processing circuit 11.

The laser light having passed through the beam splitter 17 is introduced into the scanner section 14. The scanner section 14 is configured from, for example, a single two-axis scanner 141. The incident laser light is subjected to horizontal and vertical modulation in regard to the irradiation angle by the two-axis scanner 141 and then projected to a screen not shown. It is to be noted that, while the scanner section 14 is shown as an example wherein it uses the single two-axis scanner 141 to carry out scanning in both of the horizontal and vertical directions, it may otherwise be configured such that two one-axis scanners are used to carry out scanning in the horizontal direction and the vertical direction.

Usually, the scanner section 14 has built therein a sensor for detecting an irradiation angle such as the two-axis scanner 141, and angle signals in the horizontal and vertical directions are outputted from the sensor. The angle signals are inputted to the scanner driving circuit 16.

Figure 2:
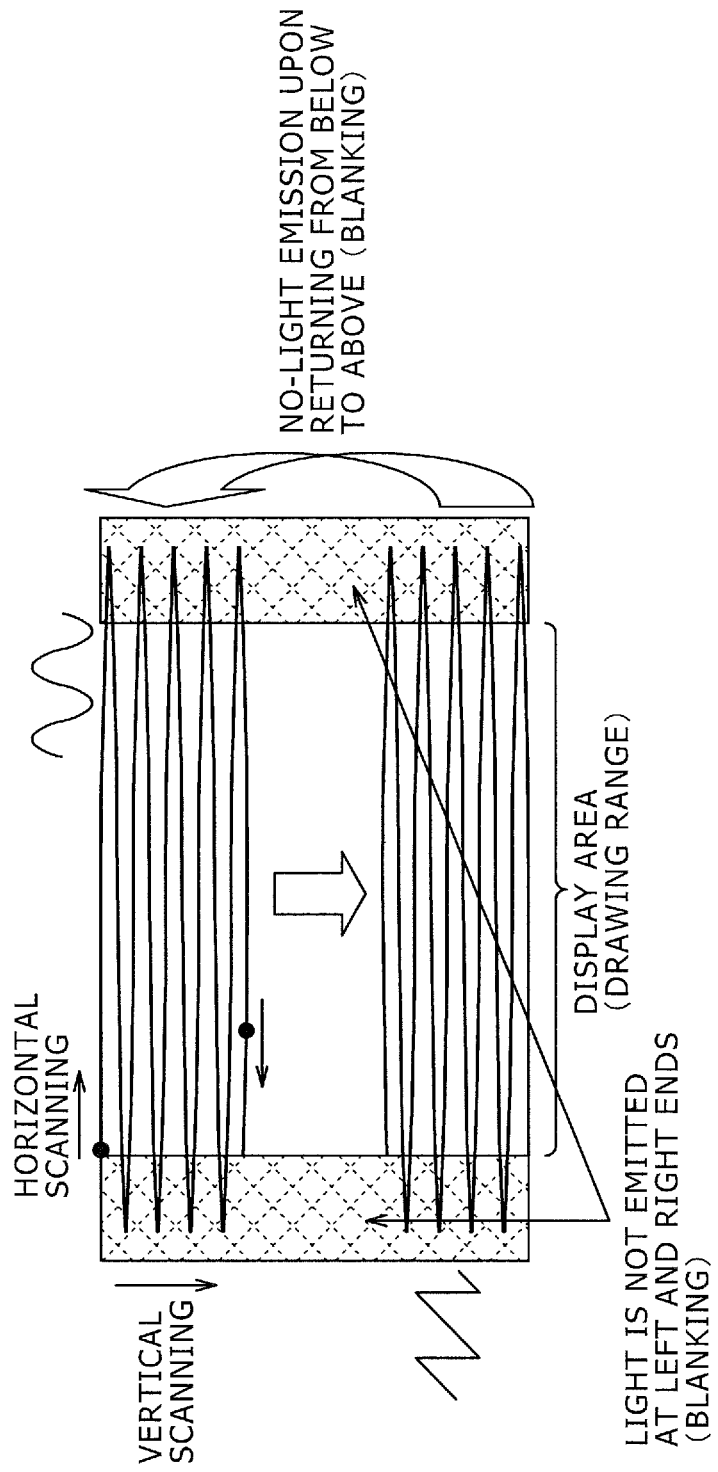
FIG. 2 is a schematic view illustrating an example of a scanning method on a screen of the laser beam scanning type.

The scanner driving circuit 16 is configured from driving circuits 161 and 162, buffers 163 and 164, an amplifier 165, a phase shift circuit 166 and so forth, and refers to the horizontal angle signal and the vertical angle signal to drive the two-axis scanner 141 so that a desired irradiation angle may be obtained. For example, while such scanning as illustrated in FIG. 2, namely, raster scanning, is to be carried out, driving with a sign waveform is carried out for the horizontal direction while driving with a waveform of a sawtooth wave synchronized with a frame rate of the video signal is carried out.

Video Signal Interface

Here, an example of a video signal interface between the video signal processing circuit 11 and the laser driving circuit 12 is described with reference to FIG. 3.

In the case of a video signal of 10-bit gradations, 10 video signals are required for each of the wavelengths of red, green and blue. Therefore, if such video signals are transmitted as they are, then a great number of signals are transferred between the video signal processing circuit 11 and the laser driving circuit 12. Therefore, in order to reduce the number of transmission lines, multiplexing of data by parallel/serial conversion is carried out.

Figure 3:
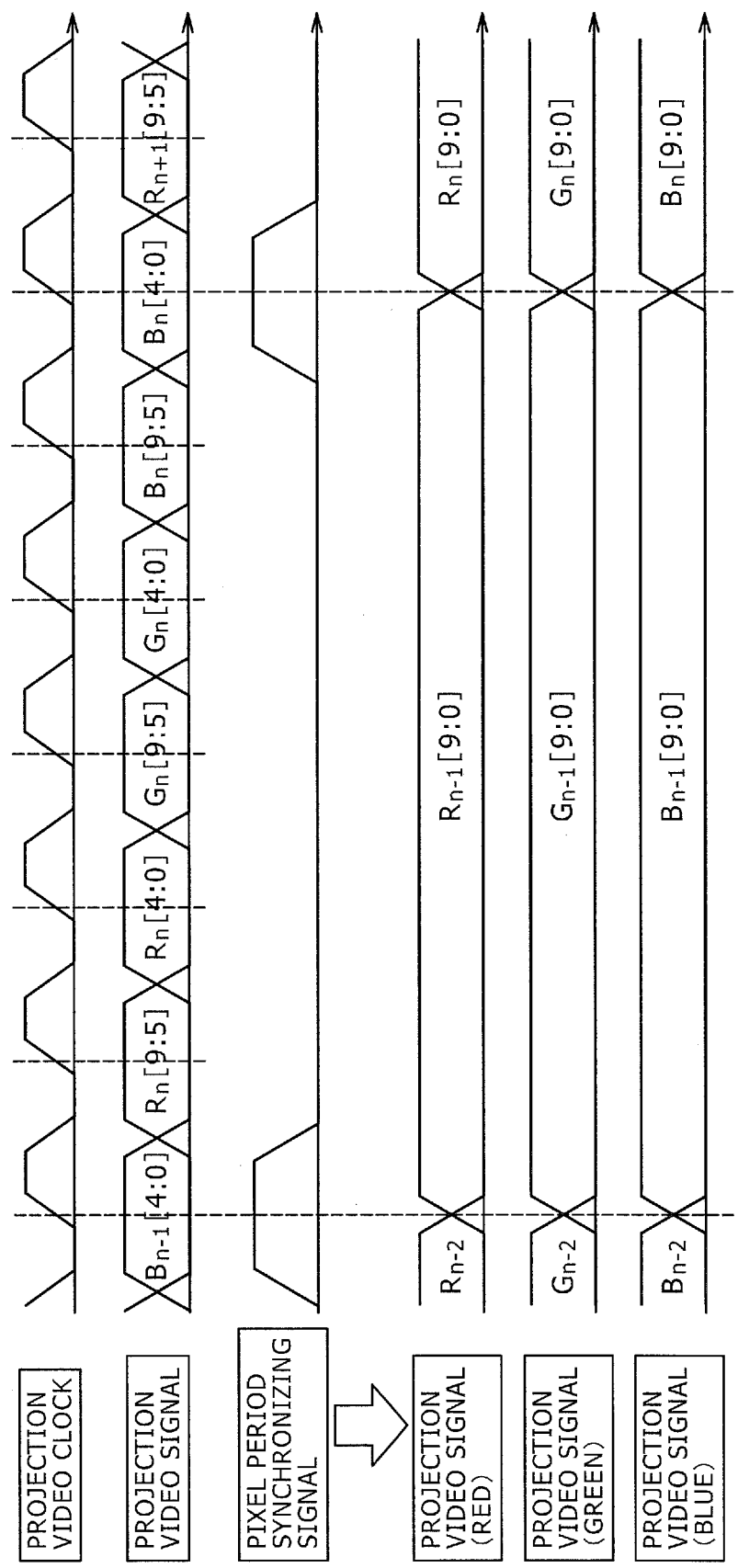
FIG. 3 is a timing chart illustrating an example of a video signal interface between a video signal processing circuit and a laser driving circuit.

FIG. 3 illustrates an example wherein 30 video signals are multiplexed into five signals. Referring to FIG. 3, a projection video signal is obtained by parallel/serial conversion of video signals for each pixel in a period equal to ⅙ that of one pixel and is outputted from the video signal processing circuit 11. Since one signal includes 2-bit signals of each of red, green and blue, the five transmission lines can transmit a 10-bit gradation signal for the three wavelengths.

On the other hand, the laser driving circuit 12 side carries out serial/parallel conversion of multiplexed video signals to demultiplex the video signals into video signals for each pixel to generate projection video signals for red, green and blue illustrated in FIG. 3. Thereupon, a video signal clock of a frequency equal to ⅙ that of one pixel and a pixel period synchronizing signal (not shown) indicative of a start of a pixel are required. Therefore, a projection video clock signal and a pixel period synchronizing signal are transmitted together with the projection video signals.

It is to be noted that, since the parallel/serial conversion circuit of the laser driving circuit 12 side does not directly relate to the technology of the present disclosure, description of the parallel/serial conversion circuit is omitted in the following description. Thus, it is assumed that the projection video signals are in a state after they are separated for each pixel of each wavelength like the projection video signals of red, green and blue.

Speckle Noise

Figure 4:
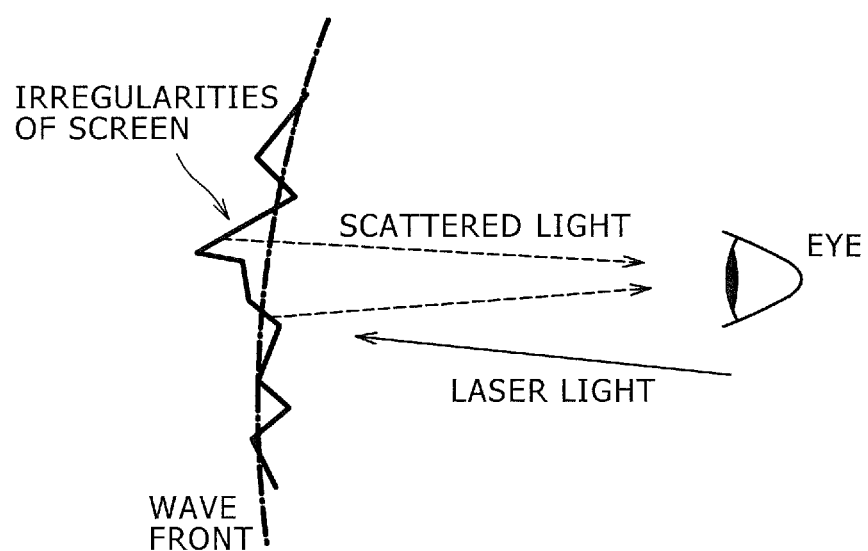
FIG. 4 is a model diagram illustrating speckle noise.

Incidentally, as one of subjects of a projector apparatus wherein a laser is used as a light source is speckle noise by which countless speckles appear on a video on the screen. Speckle noise is described with reference to a model of FIG. 4. In particular, laser light emitted from a projector apparatus is reflected by the screen and then enters the eye and forms an image on the retina of the eye. At this time, the optical path length while the light comes to the retina from the laser light source varies at random depending upon minute irregularities which the screen has.

In the case where coherent light which is uniform in wavelength and phase like laser light is used as a light source, if a plurality of light beams having phases different from each other depending upon the difference in optical path length enter the eye, then they interfere with each other to give rise to interference fringes in which the intensity is distributed at random. The technology of the present disclosure has been devised in order to reduce speckle noise arising from the fact that laser light is coherent light.

2-1. Basic Configuration of the Laser Driving Circuit

Figure 5:
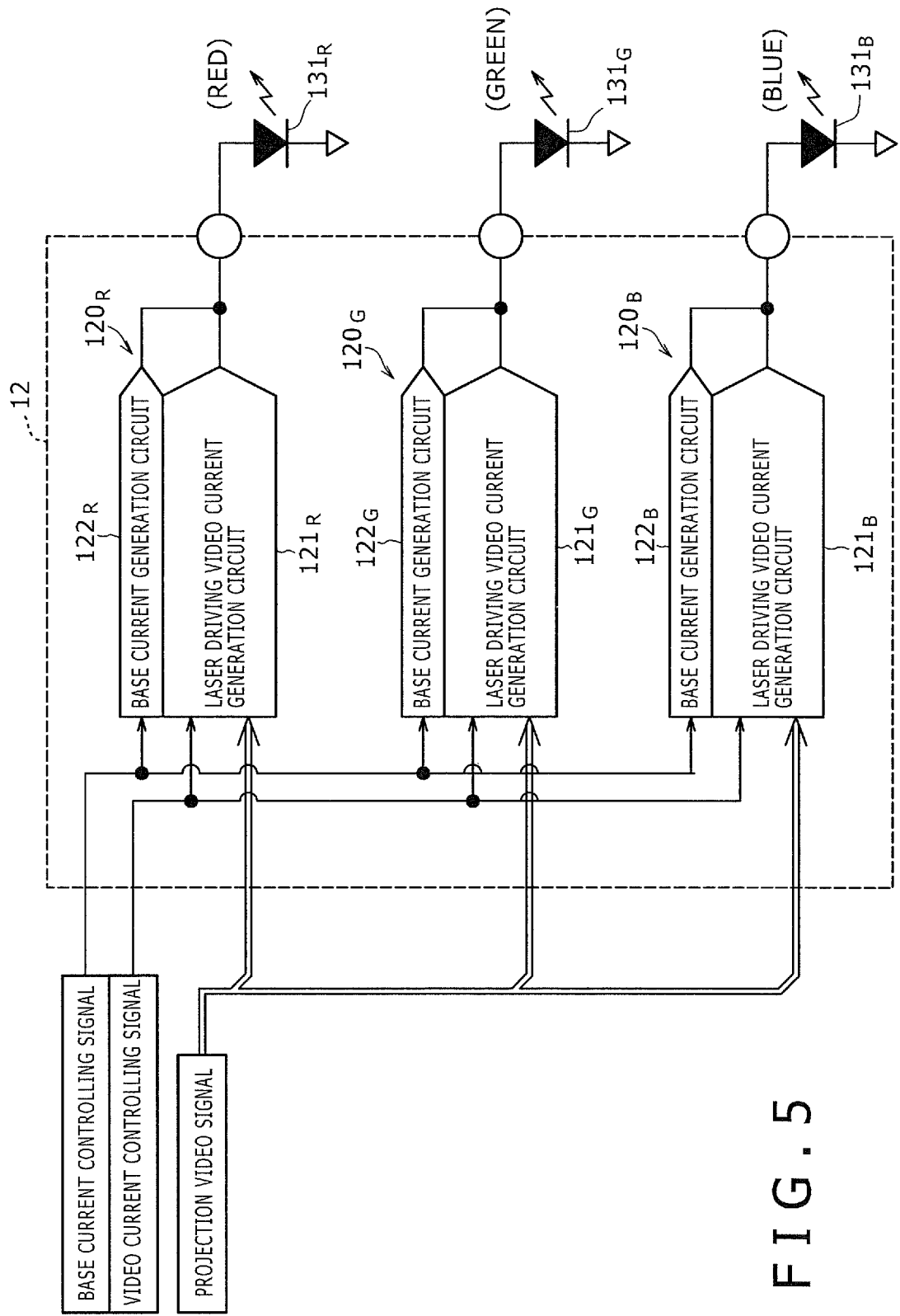
FIG. 5 is a block diagram showing a basic configuration of a laser driving circuit of the present disclosure.

Now, a basic configuration of the laser driving circuit to which the technology of the present disclosure is applied is described. FIG. 5 shows in block diagram a basic configuration of the laser driving circuit 12 used in the projector apparatus $10_A$ of the laser beam scanning type shown in FIG. 1, namely, the laser driving circuit to which the technology of the present disclosure is applied.

As described hereinabove, usually three different laser light sources $131_R$, $131_G$ and $131_B$ for red, green and blue are used as light sources. Correspondingly, the laser driving circuit 12 includes three driving sections $120_R$, $1120_G$ and $120_E$ equally to the number of light sources. Further, as described hereinabove, projection video signals corresponding to the wavelengths of three different laser beams synchronized with the movement of the two-axis scanner 141 of the scanner section 14 are inputted to the laser driving circuit 12.

The driving sections $120_R$, $1120_G$ and $120_B$ include laser driving video current generation circuits $121_B$, $121_G$ and $121_E$ and base current generation circuits $122_3$, $112_G$ and $112_B$, respectively. Here, the configuration of the laser driving video current generation circuit $121_R$ and the base current generation circuit $122_R$ for red is described particularly. However, also the laser driving video current generation circuits $121_6$ and $121_E$ and the base current generation circuits $112_G$ and $112_E$ for green and blue have similar configurations.

The laser driving video current generation circuit $121_R$ amplifies a projection video signal inputted thereto to a current value necessary for the emission of laser light and outputs the amplified projection video signal as laser driving current for driving the laser light source $131_R$ of red. Here, the projection video signal inputted to the laser driving circuit 12 may be any of an analog signal and a digital signal.

If the projection video signal is inputted in the form of a digital signal, a circuit having a digital/analog conversion function for converting a digital signal into an analog signal is used as the laser driving video current generation circuit $121_R$. Thereupon, a video current controlling signal supplied from the video signal processing circuit 11 to the laser driving circuit 12 is used to control the full scale current in the digital/analog conversion.

It is to be noted that, although FIG. 5 shows a circuit configuration wherein current is supplied, for example, to the anode of a semiconductor laser used for the laser light sources $131_R$, $131_G$ and $131_B$, another configuration wherein current is drawn in through the cathode may be applied. Which one of the circuit configurations should be adopted may be determined arbitrarily.

Figure 6:
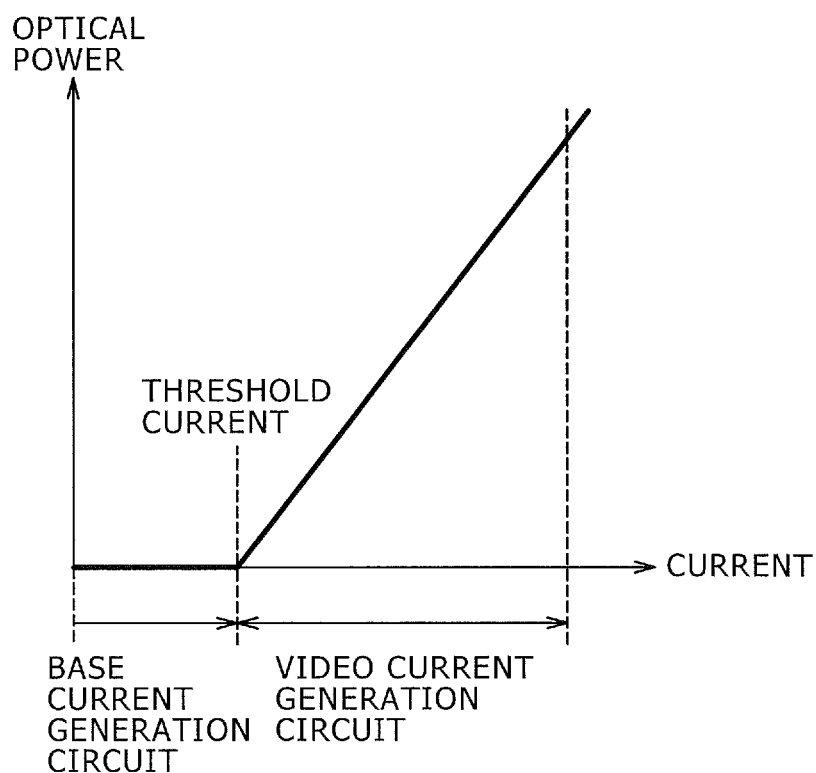
FIG. 6 is a diagram illustrating a current-optical output characteristic of a semiconductor laser.

Incidentally, a semiconductor laser has such a current-optical output characteristic as illustrated in FIG. 6, and no optical power is outputted where the current is lower than a threshold value. The base current generation circuit $122_R$ is used to supply current corresponding to the threshold value to the laser light source $131_R$. By supplying current corresponding to the threshold value from the base current generation circuit $122_R$ to the laser light source $131_R$ in this manner, the dynamic range of the laser driving video current generation circuit $121_R$ can be used effectively.

It is to be noted that, since the presence or absence of the base current generation circuit $122_R$ does not directly relate to the technology of the present disclosure, for the convenience of description and illustration, description and illustration of the base current generation circuit $122_R$ are sometimes omitted in the description and illustration of the embodiment.

In the laser driving circuit 12 of the present disclosure having the configuration described above, a high frequency signal of a frequency higher than the frequency band of the video signal is superposed on laser driving current generated by the laser driving video current generation circuits $121_R$, $121_G$ and $121_R$.

Figure 7:
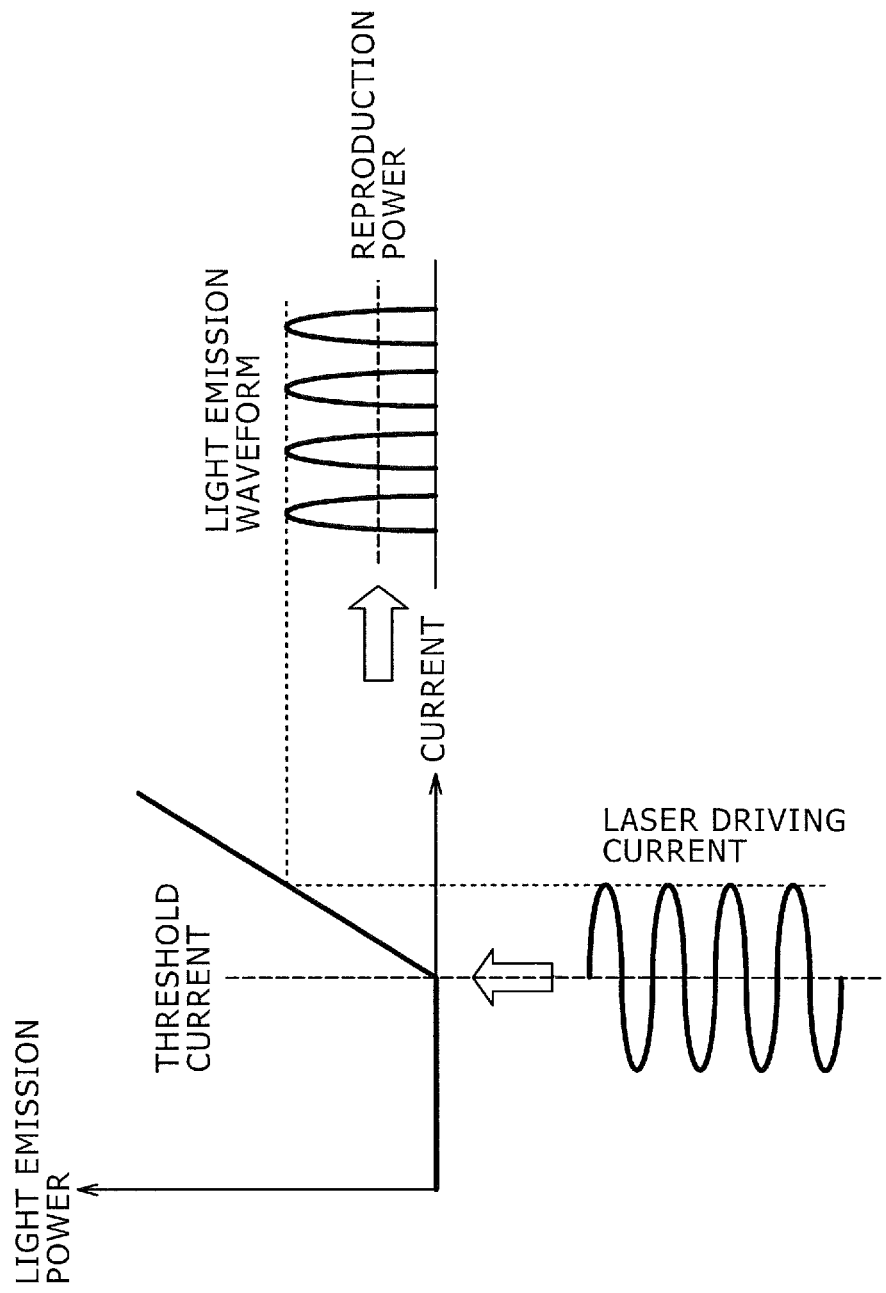
FIG. 7 is a diagrammatic view illustrating a concept of superposition of a high frequency signal on laser driving current.

In order to superpose the high frequency signal, it is modulated with an amplitude which crosses threshold current of the semiconductor laser as seen in FIG. 7. FIGS. 8A and 8B illustrate a variation of a wavelength spectrum of laser output light by superposition of the high frequency signal on the laser driving current. The semiconductor originally oscillates in the single mode as seen from FIG. 8A. In this instance, the laser light has high coherence.

In the meantime, if a high frequency signal is superposed on the laser driving current, then the laser oscillates in a multi-mode in which many wavelength components are included as seen from FIG. 8B. In this instance, the coherence of the laser light drops or decreases. Generally, as the amplitude of the high frequency signal to be superposed on the laser driving current increases, there is a tendency that the wavelength spectrum becomes wider.

As described hereinabove, by superposing a high frequency signal on laser driving current based on a video signal inputted and driving a laser light source with the laser driving current on which the high frequency signal is superposed, the coherence drops because the wavelength spectrum of the laser light emitted from the laser light source expands. As a result, speckle noise arising from the fact that the laser light is coherent light can be reduced.

Light Emission Delay with Respect to Laser Driving Current

Incidentally, one of subjects of a projector apparatus which uses a laser as a light source is such a light emission delay with respect to laser driving current as illustrated in FIG. 9. Here, the "light emission delay with respect to laser driving current" signifies that start of light emission from the proximity of the threshold value of the light source delays with respect to the laser driving current. FIG. 9 is a waveform diagram illustrating an example of a laser light emission delay when a high frequency signal is superposed on laser driving current.

In laser light emission, if a laser light source emits light after the laser driving current becomes lower than the threshold current of the laser light source, then the period of time until light emission is started, namely, the light emission delay amount, increases significantly. The delay amount differs depending upon the wavelength of the laser light and is several ns. Here, in order to achieve improvement against speckle noise, it is necessary to superpose a high frequency signal of approximately 200 to 400 MHz with an amplitude which crosses the threshold current of the laser as described hereinabove.

With such a high frequency superposition waveform, if the light emission delays by several ns, then the start of light emission which is light emission in the proximity of the threshold value of the laser light source is delayed and the light emission period decreases. Since the reproduction power of the laser light source becomes an average luminance of the high frequency superposition waveform, decrease of the reproduction power, distortion of the emission light waveform and so forth occurs. Thus, there is the possibility that the picture quality of the display image may be degraded. The emission light waveform of the laser light source can be shaped or adjusted by correction of the waveform of the laser driving current.

In the following, particular working examples for adjusting the emission light waveform of the laser light source in order to maintain the emission light waveform of the laser light source in a favorable state are described.

2-2. Working Example 1

FIG. 1 shows in block diagram a configuration of a laser driving circuit according to a working example 1 of the first embodiment. The laser driving circuit $12_A$ according to the working example 1 includes, in addition to the laser driving video current generation circuits $121_R$, $121_G$ and $121_B$, a superposition signal oscillator 123, and 2-input 1-output switches (hereinafter referred to as video signal switches) $124_R$, $124_G$ and $124_B$. The superposition signal oscillator 123 generates or oscillates a high frequency signal to be superposed on laser driving current.

The superposition signal oscillator 123 and the video signal switches $124_R$, $124_G$ and $124_B$ cooperatively configure a high frequency superposition section which superposes a high frequency signal on laser driving current generated by the laser driving video current generation circuits $121_R$, $121_G$ and $121_B$. The laser driving video current generation circuits and the high frequency superposition section in the laser driving circuit provide a laser driving video current generation step and a high frequency superposition step in the laser driving method of the present disclosure, respectively. This similarly applies also to the working examples hereinafter described.

The superposition signal oscillator 123 includes a duty adjustment circuit 125 and is configured such that it can adjust the duty of a high frequency superposition signal by an action of the duty adjustment circuit 125. The duty adjustment circuit 125 configures a waveform correction section configured to correct the waveform of a high frequency signal. The waveform correction section provides a waveform correction step in the laser driving method of the present disclosure. Although an output of the superposition signal oscillator 123 here is applied commonly to the circuits for the individual wavelengths, also it is possible to use a different configuration wherein the superposition signal oscillator 123 is provided for each wavelength such that the duty is adjusted for each wavelength.

A projection video signal is inputted to the laser driving video current generation circuits $121_R$, $121_G$ and $121_B$ through video signal switches $124_R$, $124_G$ and $124_B$ provided individually for the wavelengths. The video signal switches $124_R$, $124_G$ and $124_B$ select the projection video signal and an output OFF, which may be, for example, the ground level, in response to a high frequency signal outputted from the superposition signal oscillator 123.

In the laser driving circuit $12_A$ of the configuration described above, the video signal switches $124_R$, $124_G$ and $124_B$ select the projection video signal and the output OFF in response to the H/L level of the high frequency signal outputted from the superposition signal oscillator 123 and having the duty adjusted by the duty adjustment circuit 125. Here, the "H" level signifies a high level of the high frequency signal, and the "L" level signifies a low level of the high frequency signal.

By the selection of the high frequency signal in response to the H/L level by the video signal switches $124_R$, $124_G$ and $124_B$, a projection video signal on which the high frequency signal having the adjusted duty is superposed is generated. The projection video signal on which the high frequency signal is superposed is inputted to the laser driving video current generation circuits $121_R$, $121_G$ and $121_B$.

The laser driving video current generation circuits $121_R$, $121_G$ and $121_B$ amplify the projection video signals on which the high frequency signals are superposed to a current value necessary for driving of the laser light sources $131_R$, $131_G$ and $131_B$ and supply the amplified projection video signals as laser driving current to the laser light sources $131_R$, $131_G$ and $131_B$, respectively. At this time, the laser driving current drives, as current on which the high frequency signals are superposed, the laser light sources $131_R$, $131_G$ and $131_B$.

Figures 11A, 11B:
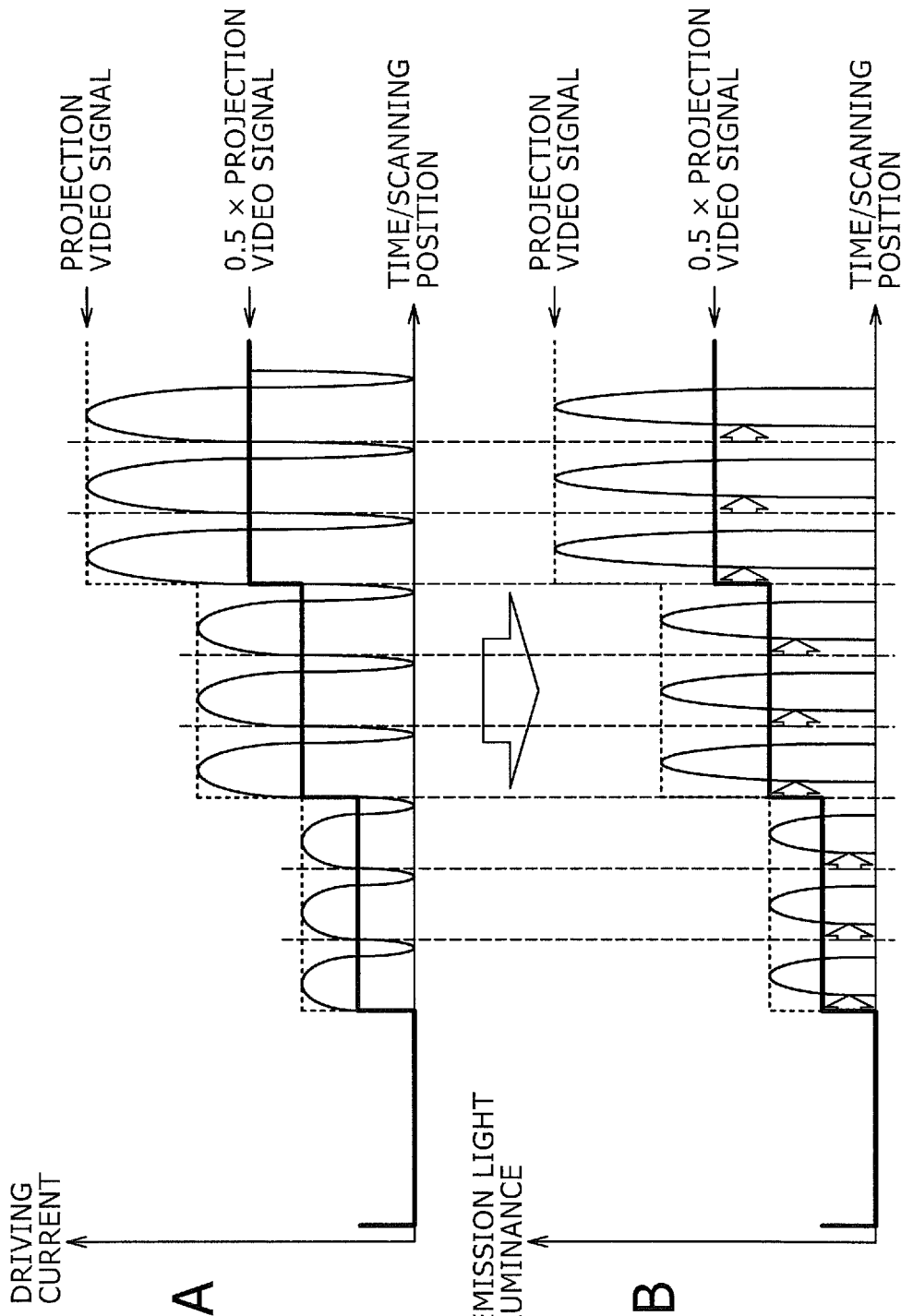
FIGS. 11A and 11B are waveform diagrams illustrating laser driving current generated by the laser driving circuit of FIG. 10 and a laser emission light waveform.

By the driving by the laser driving current on which the frequency signals are superposed, the laser light sources $131_R$, $131_G$ and $131_B$ output emission light waveforms which have such a light emission delay as illustrated in FIG. 11B. In particular, FIGS. 11A and 11B illustrate an example wherein the duty of a waveform of laser driving current is adjusted and the light emission period is increased by the light emission delay amount to improve the duty of the emission light waveform.

Here, if the amplitude of the high frequency signal to be superposed on the laser driving current increases, then it gives rise to such bad influences as increase of the power consumption and degradation in terms of noise. Therefore, preferably the amplitude of the high frequency signal to be superposed is minimized. FIG. 11B illustrates an example wherein duty adjustment of the waveform of laser driving current is carried out so that the duty of the emission light waveform becomes 50%. If it is intended to output a projection video signal with a smaller amplitude, then it is effective to increase the duty to more than 50% to increase the average luminance.

However, if the duty is increased excessively intending to enhance the average luminance, then the OFF period of the laser light sources $131_R$, $131_G$ and $131_B$ decreases, resulting in the possibility that the laser light sources $131_R$, $131_G$ and $131_B$ may fail to respond to high frequency superposition. Here, the improvement effect regarding speckle noise enhances where the amplitude of the high frequency signal to be superposed on the laser driving current crosses the threshold current of the laser light source.

Therefore, the duty adjustment of the emission light waveform is carried out to raise the average luminance to decrease the amplitude of the high frequency signal to be superposed on the laser driving current. Further, as the adjustment range of the duty, it is assumed that the laser light source responds sufficiently quickly to high frequency superposition and the duty adjustment is carried out within a range within which the amplitude of the high frequency signal to be superposed on the laser driving current crosses the threshold current of the laser light source.

Superposition Signal Oscillator Having the Duty Adjustment Circuit

Here, a particular circuit configuration of the superposition signal oscillator 123 which has the duty adjustment circuit 125 is described.

Circuit Example 1

Figure 12:
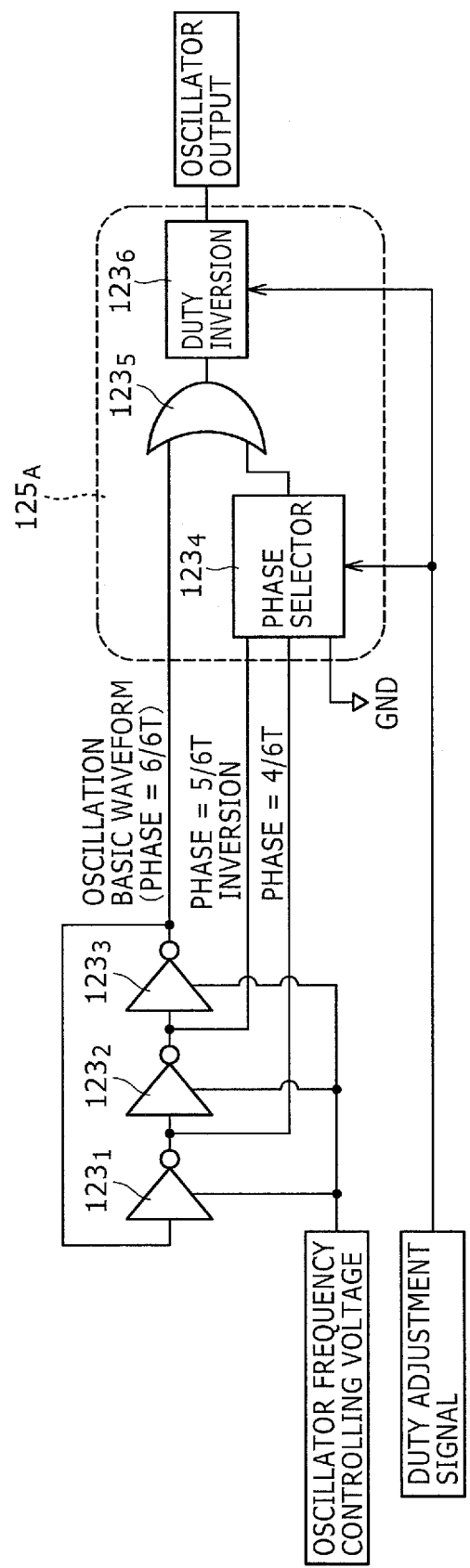
FIG. 12 is a block diagram showing a configuration of a superposition signal oscillator in the working example 1 which has a duty adjustment circuit according to a circuit example 1.

FIG. 12 shows an example of a configuration of the superposition signal oscillator 123 which has a duty adjustment circuit $125_A$ according to a circuit example 1. Referring to FIG. 12, the superposition signal oscillator 123 has a configuration of a ring oscillator which includes an inverter $123_1$, another inverter $123_2$ and a further inverter $123_3$ connected in a ring.

In the ring oscillator, the inverter $123_3$ of the third stage outputs an oscillation basic waveform of a phase=6/6 T where T is a period. From the inverter $123_2$ of the second stage, a waveform of a phase=5/6 T is outputted. From the inverter $123_1$ of the first stage, a waveform of a phase=4/6 T is outputted.

The duty adjustment circuit $125_A$ includes a phase selector $123_4$, an OR gate $123_5$, and a duty inversion circuit $123_6$. In the duty adjustment circuit $125_A$, the phase selector $123_4$ receives an inverted waveform of a phase=5/6 T, a waveform of another phase=4/6 T and the GND (ground) level as inputs thereto and carries out selection of one of the inputs and inversion of an output in response to a duty adjustment signal.

Here, the "duty adjustment signal" is a signal generated based on a laser power monitor signal by the laser controlling section 114 shown in FIG. 1 as described hereinabove. More particularly, the "duty adjustment signal" is a signal for adjusting the waveform of the high frequency signal to be superposed on the laser driving signal so as to have an optimum duty.

The OR gate $123_5$ logically ORs the oscillation basic waveform, which has the phase=6/6 T, of the ring oscillator and a waveform selected by the phase selector $123_4$. The duty inversion circuit $123_6$ inverts the duty of an output waveform of the OR gate $123_5$.

Figure 13:
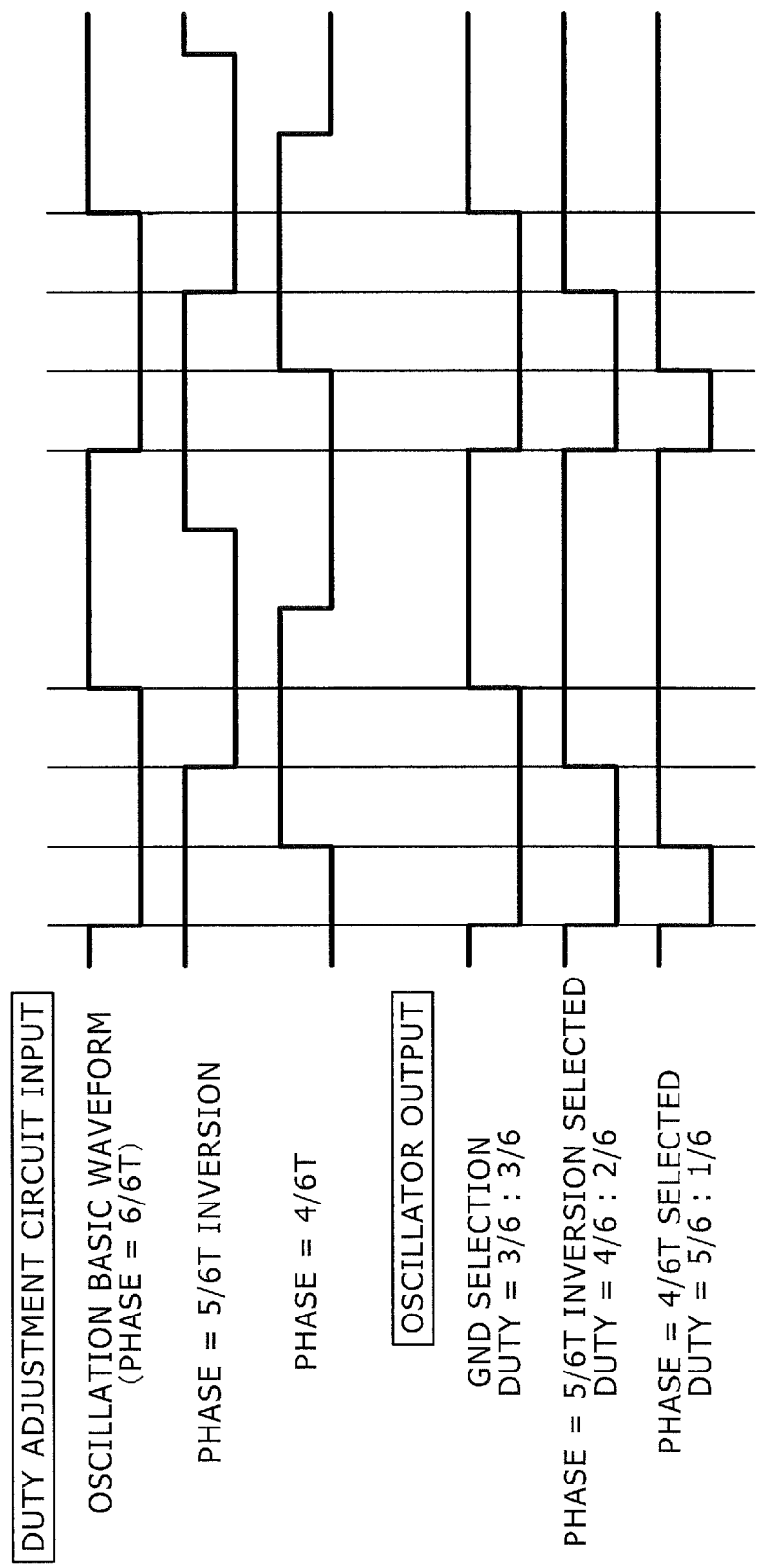
FIG. 13 is a waveform diagram of signals at different portions of the superposition signal oscillator shown in FIG. 12.

FIG. 13 illustrates signal waveforms of the components of the superposition signal oscillator 123 which includes the duty adjustment circuit $125_A$ according to the circuit example 1, namely, input waveforms to the duty adjustment circuit $125_A$ and output waveforms of the superposition signal oscillator 123.

According to the duty adjustment circuit $125_A$ having the configuration described above, phase selection and inversion of the ring oscillator can be carried out in accordance with the duty adjustment signal. Consequently, a high frequency signal to be outputted from the superposition signal oscillator 123, namely, a waveform of a high frequency signal to be superposed on laser driving current, can be adjusted so as to have an optimum duty.

If the duty of a high frequency superposition waveform is adjusted for the wavelength of each laser light source in accordance with the light emission delay of the laser light source, then the duty of the emission light waveform becomes 50%, and such an average luminance equal to one half that of the projection video signal as illustrated in FIGS. 11A and 11B is obtained. In particular, according to the laser driving circuit $12_A$ in the working example 1, by carrying out waveform correction of the high frequency superposition signal in response to the duty adjustment signal, it is possible to reduce speckle noise, which arises from the fact that the laser light is coherent light. Meanwhile, the emission light waveform of the laser light source is maintained in a good state.

It is to be noted that, while, in the superposition signal oscillator 123 which includes the duty adjustment circuit $125_A$ according to the circuit example 1, the duty is adjusted so that the high level period of the oscillator output waveform may be expanded, also it is possible to adjust the duty so that the low level period may be expanded by inverting the output by a duty inversion circuit. Further, while, in the case where the ring oscillator has a three-stage configuration of inverters, duty adjustment can be carried out with a 1/6 T step, if the number of stages of inverters is increased, then adjustment with a finer step can be achieved.

Circuit Example 2

Figure 14:
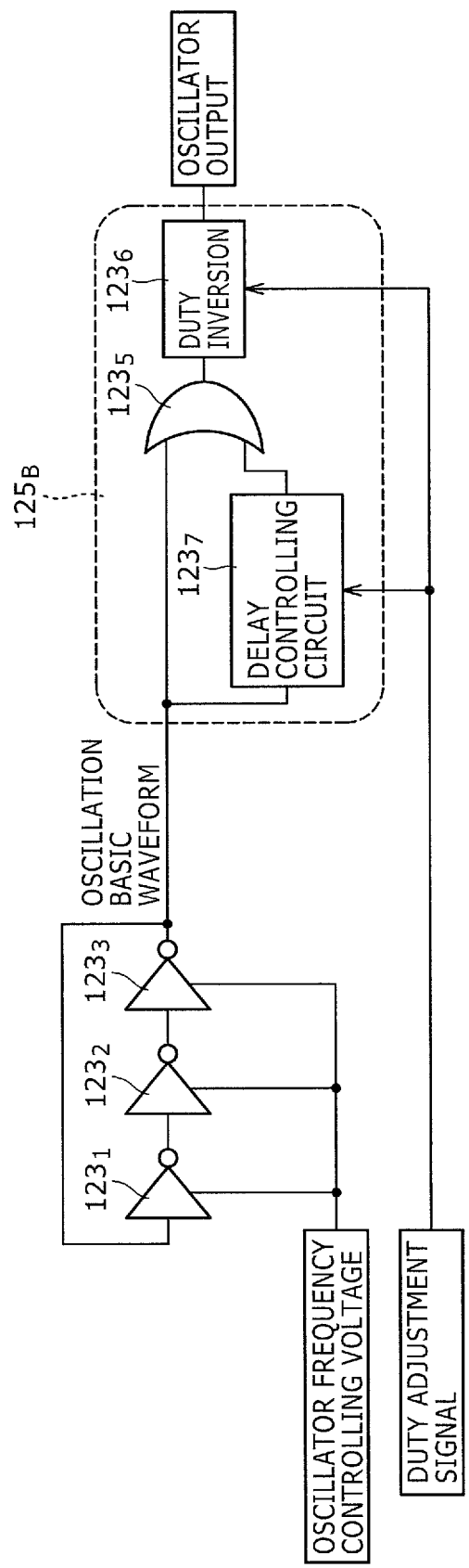
FIG. 14 is a block diagram showing a configuration of a superposition signal oscillator in the working example 1 which has a duty adjustment circuit according to a circuit example 2.

FIG. 14 shows an example of a configuration of the superposition signal oscillator 123 which has a duty adjustment circuit $125_B$ according to a circuit example 2. Referring to FIG. 14, the duty adjustment circuit $125_B$ according to the circuit example 2 includes an OR gate $123_5$, a duty inversion circuit $123_6$, and a delay controlling circuit $123_7$.

In the duty adjustment circuit $125_B$, the delay controlling circuit $123_7$ receives a single waveform of the ring oscillator, for example, an oscillation basic waveform having a phase=6/6 T as an input thereto and controls the delay amount for the input waveform in response to a duty adjustment signal. The OR gate $123_5$ logically ORs two oscillation basic waveforms before and after adjustment of the delay amount. The duty inversion circuit $123_6$ inverts the duty of an output waveform of the OR gate $123_5$.

In the duty adjustment circuit $125_A$ according to the circuit example 1, signals of different phases are produced from delay elements in the ring oscillator. In contrast, in the duty adjustment circuit $125_B$ according to the circuit example 2, the delay controlling circuit $123_7$ is provided separately from the ring oscillator such that a single phase is extracted from the ring oscillator to control the delay amount to carry out duty control.

Figure 15:
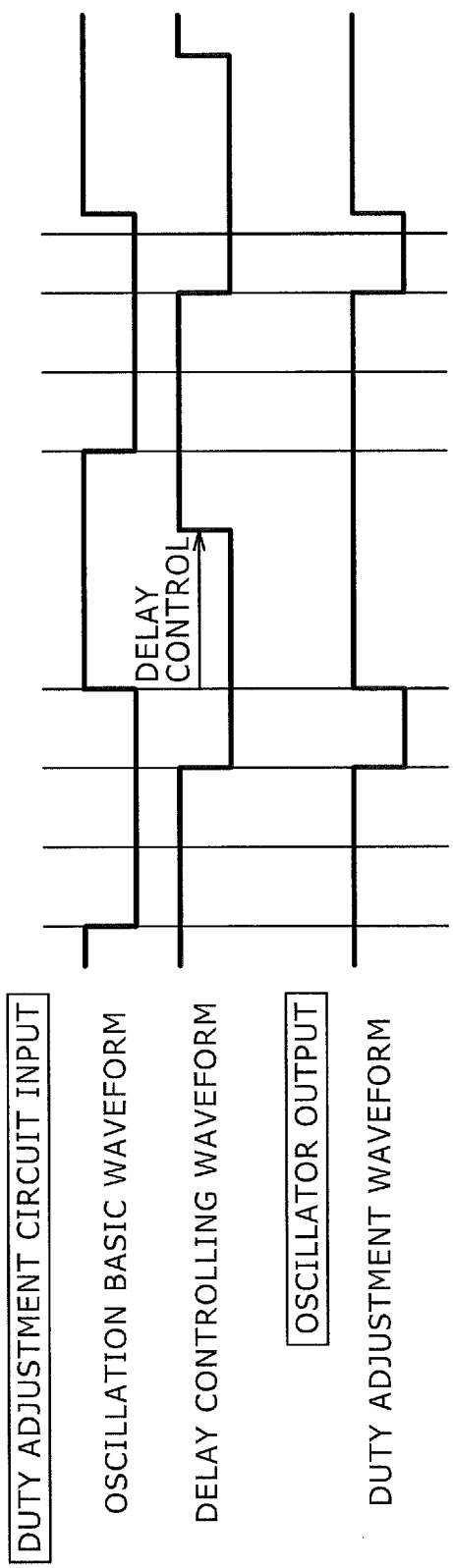
FIG. 15 is a waveform diagram of signals at different portions of the superposition signal oscillator shown in FIG. 14.

FIG. 15 illustrates signal waveforms of the components of the superposition signal oscillator 123 which includes the duty adjustment circuit $125_B$ according to the circuit example 2, namely, input waveforms to the duty adjustment circuit $125_B$ and an output waveform of the superposition signal oscillator 123.

With the duty adjustment circuit $125_B$ according to the circuit example 2, the number of steps of the delay amount can be increased without increasing the number of stages of inverters of the ring oscillator. Therefore, the oscillation frequency does not drop by increase of the number of stages of the ring oscillator. Further, since the duty adjustment can be carried out from a single phase, also with a laser driving circuit in which the superposition signal oscillator 123 is not built, duty adjustment of the high frequency superposition waveform can be carried out. The configuration of the laser driving circuit which does not have the superposition signal oscillator 123 built therein is described below as a laser driving circuit $12_B$ according to a modification to the working example 1.

2-3. Modification to the Working Example 1

Figure 16:
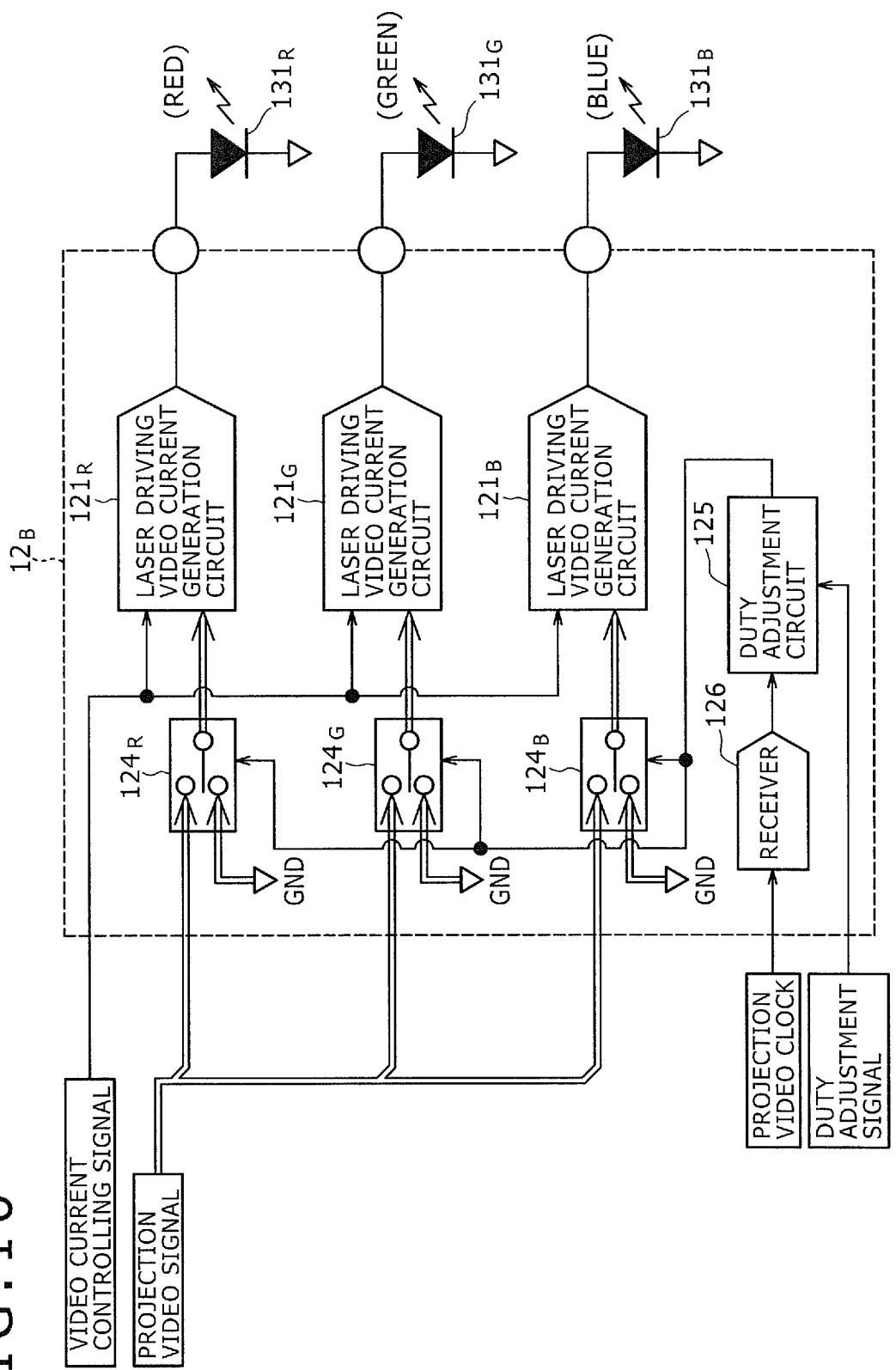
FIG. 16 is a block diagram showing a configuration of a laser driving circuit according to a modification to the working example 1.

FIG. 16 shows in block diagram a configuration of the laser driving circuit according to the modification to the working example 1. Referring to FIG. 16, the laser driving circuit $12_B$ according to the present modification is configured such that it uses a receiver 126 in place of the built-in superposition signal oscillator 123 of the laser driving circuit $12_A$ according to the working example 1. The receiver 126 receives a projection video clock inputted from the outside, particularly from the video signal processing circuit 11 shown in FIG. 1.

The projection video clock has a frequency higher than a frequency band of the projection video signal and besides is in synchronism with the period of a minimum unit in which the light and the darkness of the video signal are repeated, namely with the video signal. As described hereinabove, the "minimum unit" in which the light and the darkness of the video signal are repeated corresponds to a pixel in a flat panel display unit of a liquid crystal display apparatus, a plasma display apparatus or an EL display apparatus. Further, the "period of a minimum unit" is a pixel period in a flat display unit.

The receiver 126 is a signal source of a high frequency signal which receives a projection video clock inputted from the outside and outputs the projection video clock as a high frequency signal to be superposed on laser driving current. Where the duty adjustment circuit 125, particularly the duty adjustment circuit 125$_B$ of the circuit example 2, is disposed on the next stage to the receiver 126, also the laser driving circuit 12$_B$ which does not have the superposition signal oscillator 123 built therein can carry out duty adjustment of a high frequency superposition waveform. The duty adjustment circuit 125 configures a correction section configured to correct the waveform of a high frequency signal.

2-4. Working Example 2

Figure 17:
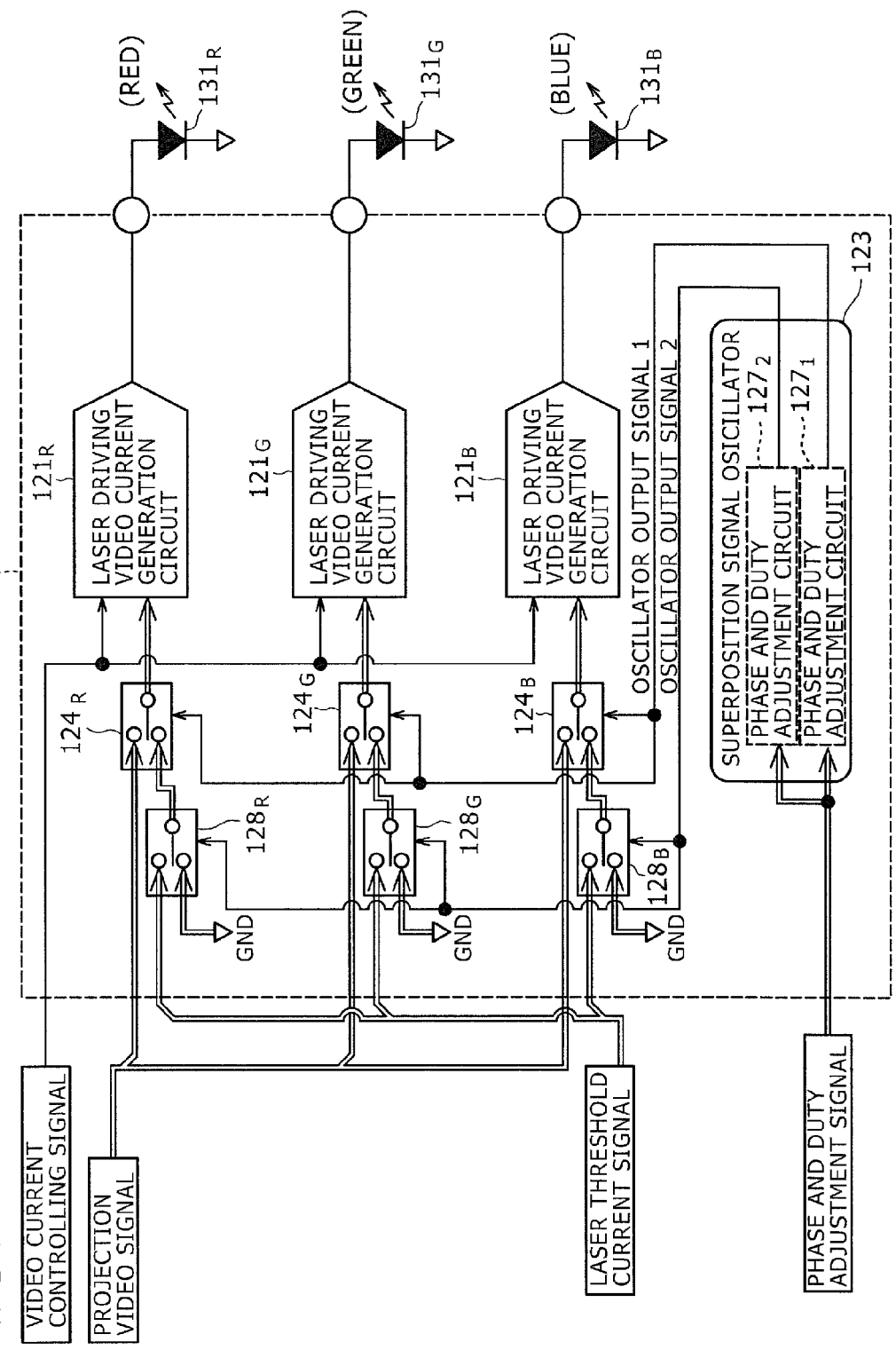
FIG. 17 is a block diagram showing a configuration of a laser driving circuit according to a working example 2 of the first embodiment.

FIG. 17 shows in block diagram a configuration of a laser driving circuit according to a working example 2 of the first embodiment. The laser driving circuit 12$_C$ according to the working example 2 includes a plurality of stages, for example, two stages, of video signal switches provided on the input side of the laser driving video current generation circuits 121$_R$, 121$_G$ and 121$_B$. In particular, the laser driving circuit 12$_C$ includes video signal switches 128$_R$, 128$_G$ and 128$_B$ provided in addition and at the preceding stage to video signal switches 124$_R$, 124$_G$ and 124$_B$ which have a basically same function to that in the working example 1.

The video signal switches 128$_R$, 128$_G$ and 128$_B$ on the preceding stage receive two inputs including a signal for waveform correction and the GND level. Here, as the signal for waveform correction, a laser threshold current signal which depends upon the threshold current of the laser light source is used. The video signal switches 124$_R$, 124$_G$ and 124$_B$ receive two inputs including a selection signal of the video signal switches 128$_R$, 128$_G$ and 128$_B$ and a projection video signal. The signal for waveform correction and the projection video signal have luminance information.

In order to control the video signal switches 124$_R$, 124$_G$ and 124$_B$ and the video signal switches 128$_R$, 128$_G$ and 128$_B$, the superposition signal oscillator 123 includes two phase and duty adjustment circuits 127$_1$ and 127$_2$ the number of which corresponds to the number of stages of video signal switches. The two phase and duty adjustment circuits 127$_1$ and 127$_2$ carry out adjustment of the phase and the duty of a high frequency signal to be superposed on laser driving current in response to phase and duty adjustment signals 1 and 2 to generate a plurality of, two in the present example, high frequency signals which are different in phase and duty from each other.

Superposition Signal Oscillator Including Two Phase and Duty Adjustment Circuits Here, a particular circuit configuration of the superposition signal oscillator 123 which includes the two phase and duty adjustment circuits 127$_1$ and 127$_2$ is described.

Figure 18:
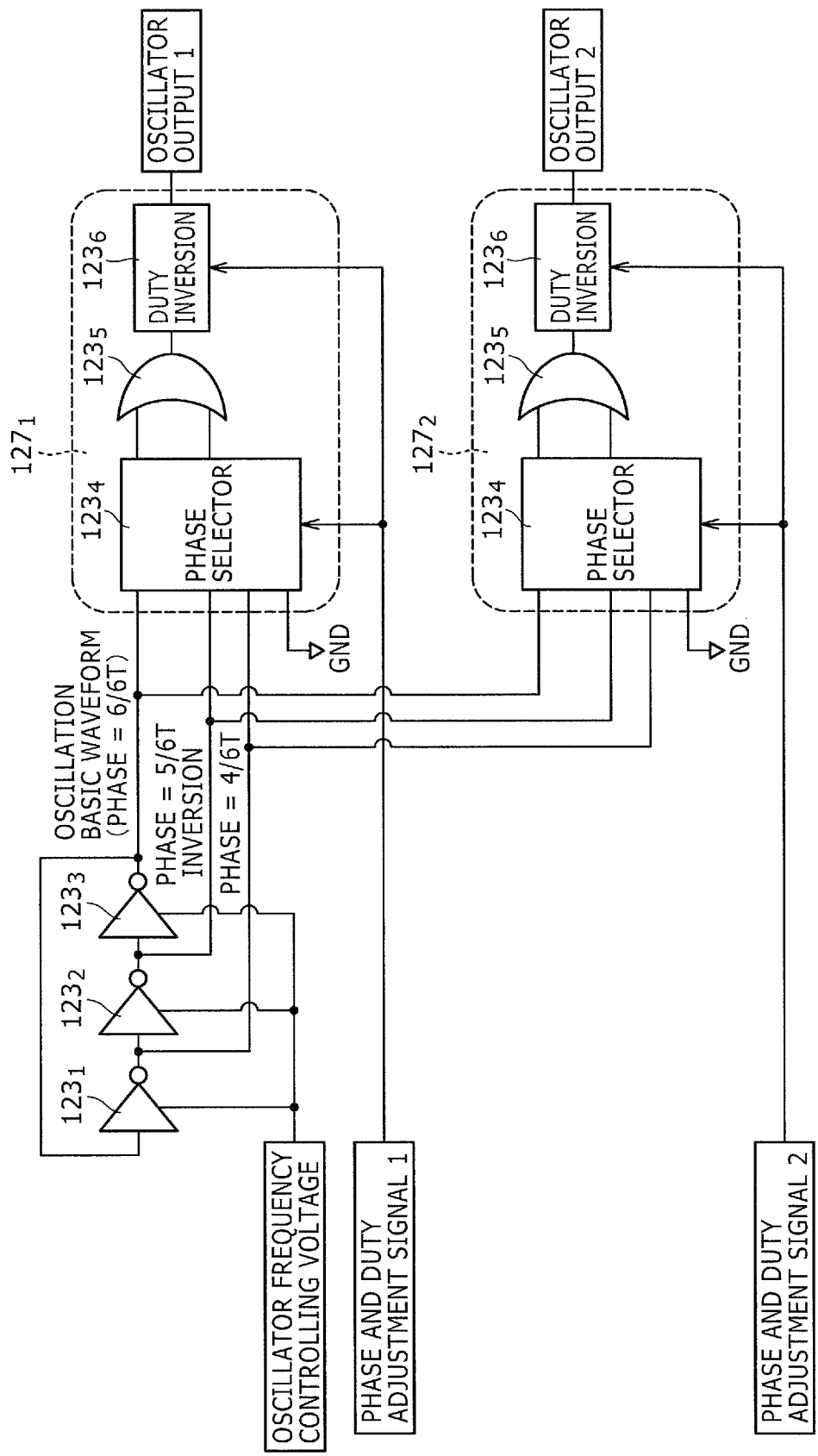
FIG. 18 is a block diagram showing a configuration of a superposition signal oscillator according to the working example 2 which has two phase and duty adjustment circuits.

FIG. 18 shows in block diagram a configuration of the superposition signal oscillator having the two phase and duty adjustment circuits. Referring to FIG. 18, the two phase and duty adjustment circuits 127$_1$ and 127$_2$ are same as the duty adjustment circuit 125$_A$ of the working example 1 in that they are configured from a phase selector 123$_4$, an OR gate 123$_5$ and a duty inversion circuit 123$_6$.

The phase and duty adjustment circuits 127$_1$ and 127$_2$ are different from the duty adjustment circuit 125$_A$ of the working example 1 in that the phase selector 123$_4$ receives an oscillation basic waveform of the ring oscillator, an inverted wave form of a phase=5/6 T, a waveform of a phase=4/6 T and the GND level as inputs thereto and can carry out phase selection and inversion of the oscillation basic waveform. Consequently, the phase relationship of the plural phase and duty adjustment circuits 127$_1$ and 127$_2$ can be adjusted between them.

Thus, an oscillator output signal 1 corresponding to a phase and duty adjustment signal 1 is outputted from the phase and duty adjustment circuit 127$_1$ and controls the video signal switches 124$_R$, 124$_G$ and 124$_B$. Meanwhile, an oscillator output signal 2 corresponding to a phase and duty adjustment signal 2 is outputted from the phase and duty adjustment circuit 127$_2$ and controls the video signal switches 128$_R$, 128$_G$ and 128$_B$.

The video signal switches 124$_R$, 124$_G$ and 124$_B$ and the video signal switches 128$_R$, 128$_G$ and 128$_B$ change over a projection video signal and a laser threshold current signal, which have a plurality of kinds of luminance information having different levels or powers, in response to the oscillator output signals 1 and 2. Consequently, multi-level, in the present example, two-level, laser driving current is generated within the superposition oscillator period based on the oscillator output signals 1 and 2.

Figure 19:
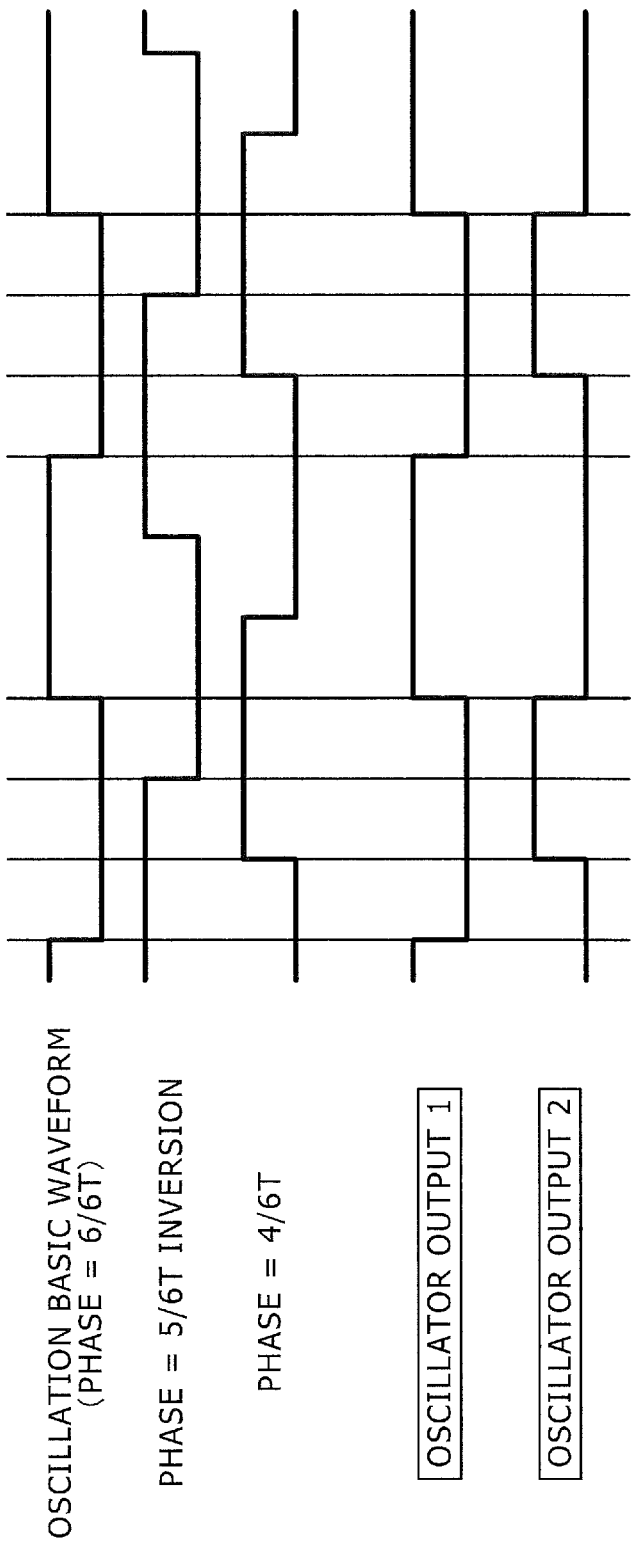
FIG. 19 is a waveform diagram of signals at different portions of the superposition signal oscillator shown in FIG. 18.

FIG. 19 illustrates signal waveforms of the components of the superposition signal oscillator 123 which includes the two phase and duty adjustment circuits 127$_1$ and 127$_2$, namely, an oscillation basic waveform, an inverted waveform of a phase=5/6 T, a waveform of a phase=4/6 T and waveforms of the oscillator output signals 1 and 2.

Figure 20:
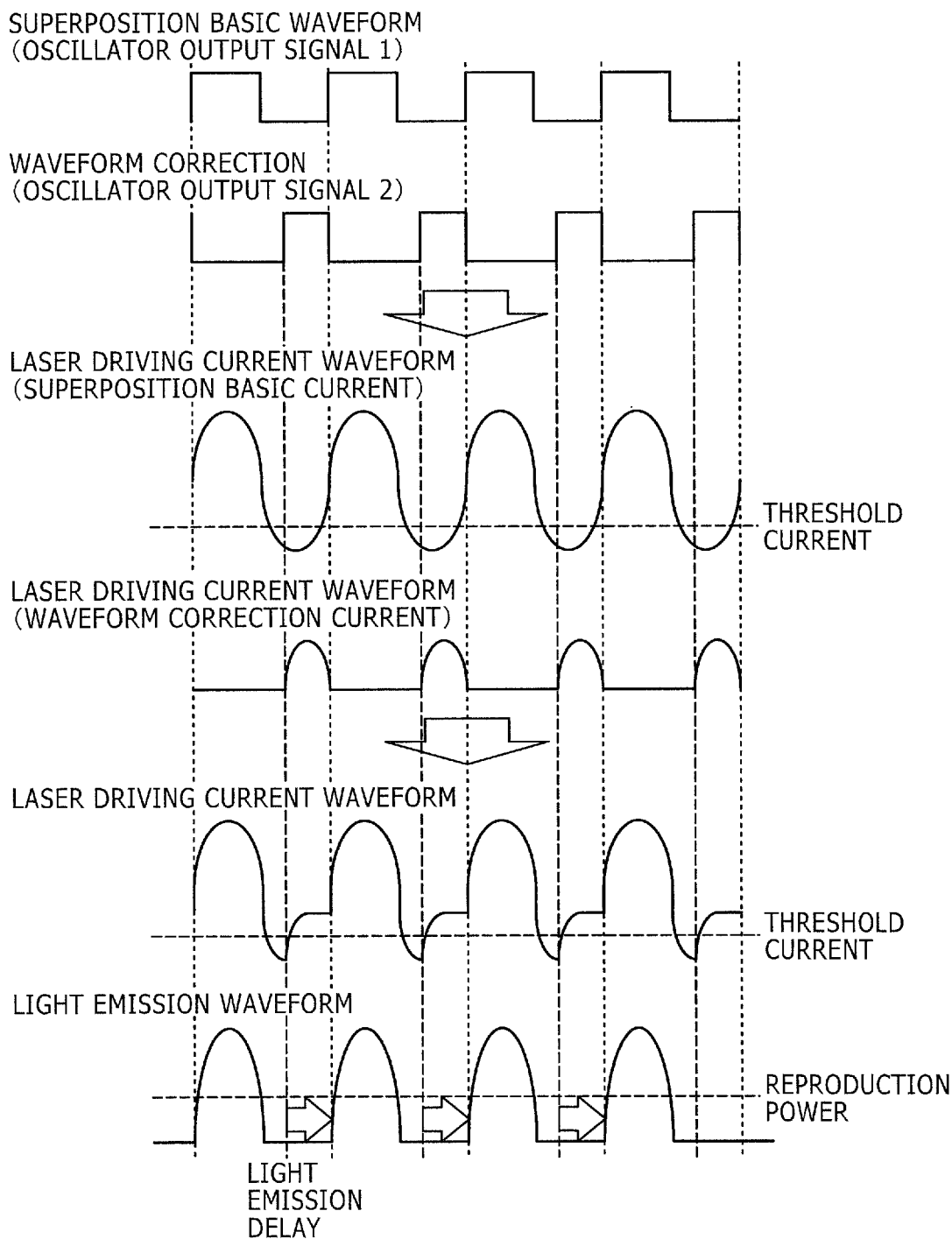
FIG. 20 is a waveform diagram illustrating laser driving current generated by the laser driving circuit shown in FIG. 17 and a laser emission light waveform.

Meanwhile, FIG. 20 illustrates laser driving current waveforms and a laser emission light waveform of the laser driving circuit 12$_C$ according to the working example 2. Laser driving current outputted from the laser driving circuit 12$_C$ is the sum of multi-level laser driving current generated within a superposition oscillation period, namely, the sum of laser driving current of a superposition basic waveform generated from the oscillator output signal 1 and laser driving current for waveform correction generated from the oscillator output signal 2.

Referring to FIG. 20, waveform correction current is adjusted so that laser driving current may not become lower than laser threshold current within a light emission delay period. Consequently, an emission light waveform whose delay is small from the superposition waveform is obtained. In particular, with the laser driving circuit 12$_C$ according to the working example 2, a small amount of waveform correction current with which the power of the laser light source does not become lower than the emitted light threshold value for a period of time of layer light emission delay can be outputted. Therefore, improvement against a laser light emission delay can be achieved with low driving current.

The laser driving circuit 12$_C$ according to the working example 2 is made under the effect of the followings. In particular, if the laser light source starts light emission after the laser driving current becomes lower than the threshold current, then time is required before light is emitted normally as described hereinabove. Therefore, current in the proximity of the threshold current is supplied before the start of light emission, and in order to increase the laser driving current from the current to a desired emitted light amplitude, multi-level, in the present example, two-level, laser driving current may be generated in the superposition oscillation period.

Then, from between the two levels of laser driving current, the current of the lower level is used as the current in the proximity of the threshold current to be supplied before the start of light emission while the current of the higher value is used as current for raising the current to a desired light emission amplitude. By generating multi-level laser driving current within a superposed oscillation period based on a plurality of high frequency signals having different phases and duties and reducing the laser driving current within a light emission delay period in this manner, average driving current can be reduced.

2-5. Working Example 3

Figure 21:
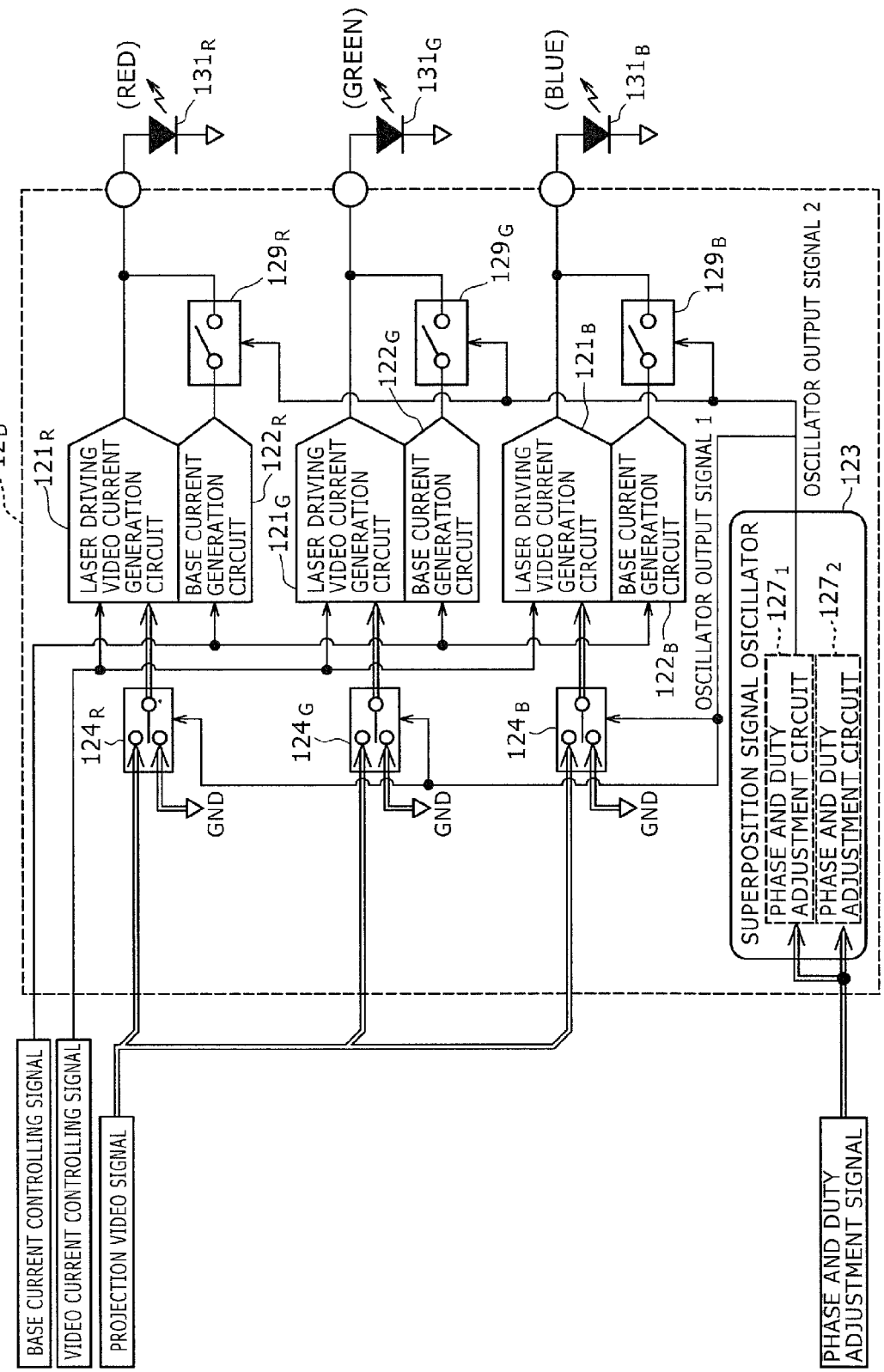
FIG. 21 is a block diagram showing a configuration of a laser driving circuit according to a working example 3 of the first embodiment.

FIG. 21 shows in block diagram a configuration of a configuration of a laser driving circuit according to a working example 3 of the first embodiment. The laser driving circuit $12_d$ according to the working example 3 has a configuration different from that of the laser driving circuit $12_C$ according to the working example 2 in order to generate multi-level laser driving current within a superposition oscillation period based on a plurality of high frequency signals having different phases and duties to reduce the laser driving current within a light emission delay period.

In particular, the laser driving circuit $12_d$ according to the working example 3 is configured such that base current switches $129_R$, $129_G$ and $129_B$ are provided on the output side of the base current generation circuits $122_R$, $112_G$ and $112_B$ in place of the video signal switches $128_R$, $128_G$ and $128_B$ of the working example 2. In the present working example 3, base current outputted from the base current generation circuits $122_R$, $112_G$ and $112_B$ becomes signals having luminance information together with projection video signals.

The superposition signal oscillator 123 includes the two phase and duty adjustment circuits $127_1$ and $127_2$ similarly as in the working example 2. An oscillator output signal 1 of the phase and duty adjustment circuit $127_1$ is used for changeover of the video signal switches $124_R$, $124_G$ and $124_B$ while an oscillator output signal 2 of the phase and duty adjustment circuit $127_2$ is used for changeover of the base current switches $129_R$, $129_G$ and $129_B$. Consequently, multi-level laser driving current is generated within a superposition oscillation period based on the oscillator output signals 1 and 2 of different phases and duties.

As described hereinabove, a general laser driving apparatus in most cases adopts a configuration wherein the base current generation circuits $122_R$, $112_G$ and $112_B$ are used to output laser threshold current. Therefore, in the laser driving circuit $12_d$ according to the working example 3, not laser threshold current information is inputted separately as in the working example, but an output of base current which relies upon laser threshold current is controlled to reduce the laser light emission delay.

Figure 22:
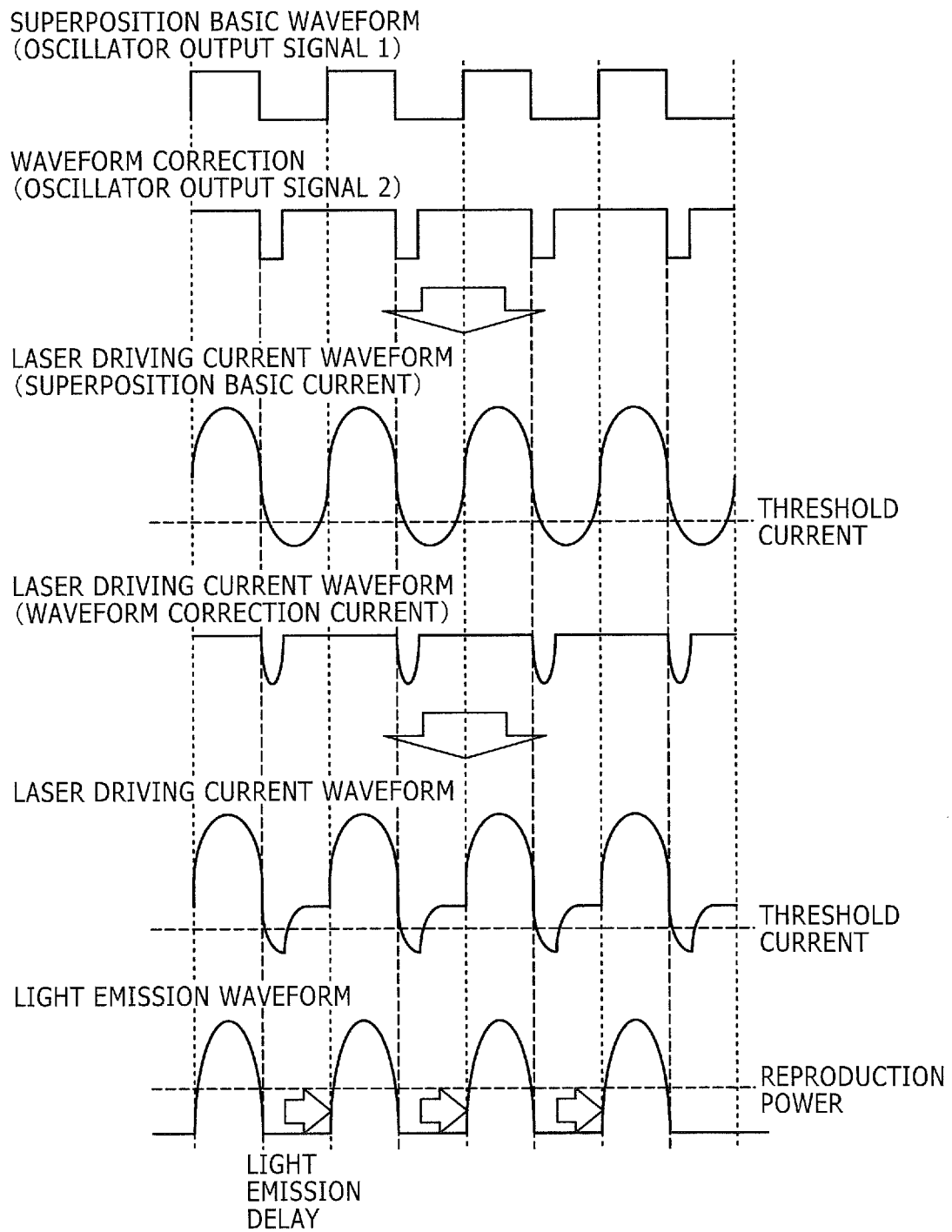
FIG. 22 is a waveform diagram illustrating laser driving current generated by a laser driving circuit according to a working example 3 and a laser emission light waveform.

FIG. 22 illustrates laser driving current waveforms and light emission waveforms in the laser driving circuit $12_d$ according to the working example 3. The base current is set to current which is not lower than the laser threshold current. By turning OFF the base current, the base current switches $129_R$, $129_G$ and $129_B$ set the laser driving current so as to be lower than the laser threshold current thereby to achieve improvement against speckle noise. Further, the base current is turned on at a timing earlier by a light emission delay time period than the superposition basic waveform to prevent the laser driving current from becoming lower than the laser threshold current within the light emission delay time period thereby to reduce the light emission delay with respect to the superposition basic waveform.

2-6. Working Example 4

Figure 23:
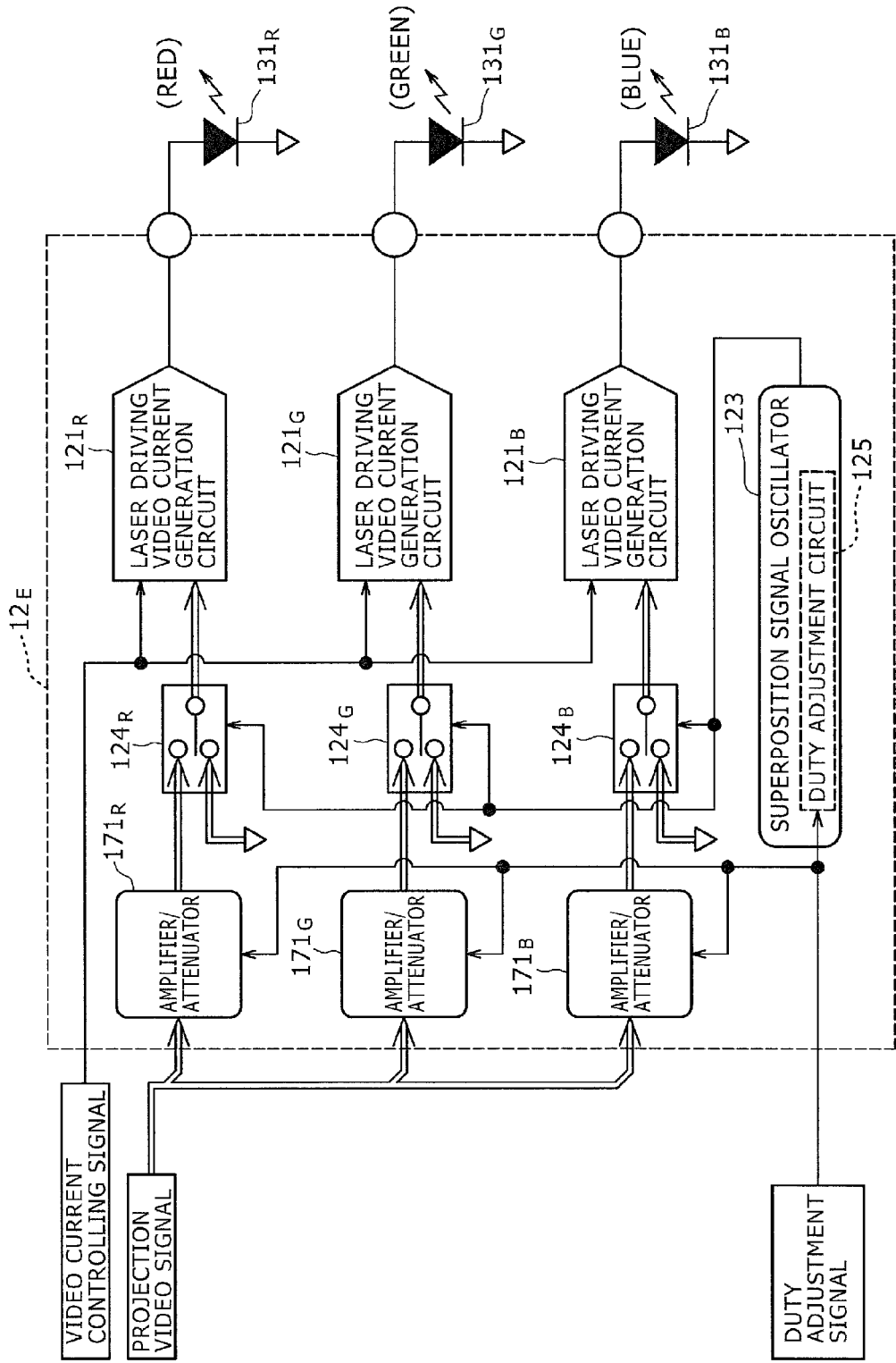
FIG. 23 is a block diagram showing a configuration of a laser driving circuit according to a working example 4 of the first embodiment.

FIG. 23 shows in block diagram a configuration of a laser driving circuit according to a working example 4 of the first embodiment. The laser driving circuit $12_e$ according to the working example 4 is configured such that it includes amplifiers/attenuators $171_R$, $171_G$ and $171_B$ for each waveform in addition to the configuration of the laser driving circuit $12_A$ according to the working example 1. The amplifiers/attenuators $171_R$, $171_G$ and $171_B$ are inserted to a stage preceding to the video signal switches $124_R$, $124_G$ and $124_B$ such that the gain thereof changes in response to a duty adjustment signal to adjust the amplitude of the projection video signal.

In the laser driving circuit $12_e$ according to the working example 4 having the configuration described above, gain control of the amplifiers/attenuators $171_R$, $171_G$ and $171_B$ is carried out in response to a duty adjustment value of a high frequency superposition waveform provided by a duty adjustment signal, namely, in response to an adjustment value from the duty adjustment circuit 125. By the gain control, adjustment of a peak value of the high frequency superposition waveform is carried out so that an average value of the laser driving current becomes fixed irrespective of the duty. Therefore, fixed average laser driving current can be obtained irrespective of the duty adjustment value.

Figure 24:
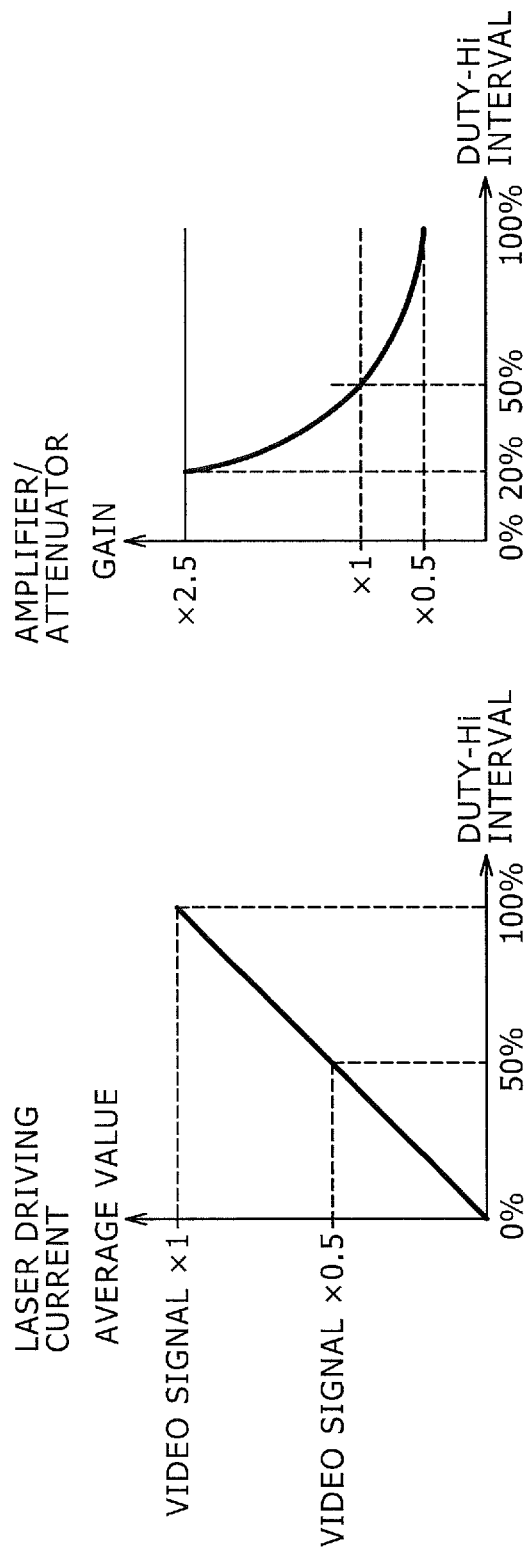
FIG. 24A is a diagram illustrating a relationship between the duty of a superposition waveform and the average value of laser driving current and FIG. 24B is a diagram illustrating a relationship between the duty of a superposition waveform and the gain of an amplifier/attenuator.

FIG. 24A illustrates a relationship between the duty of the superposition waveform and the average value of the laser driving signal, and FIG. 24B illustrates a relationship between the duty of the superposition waveform and the gain of an amplifier/attenuator. The duty indicates a ratio of a high level period to an oscillation period. Since the laser driving current increases in proportion to the duty of the high frequency superposition waveform, if the gain of the amplifiers/attenuators $171_R$, $171_G$ and $171_B$ is set to 1/duty, then average current which does not rely upon the duty is obtained.

2-7. Application Example

The technology according to the working examples 1 to 4 described above can be applied to other laser driving circuits which are different in basic configuration and, some working example can be applied as it is.

Application Example 1

Figure 25:
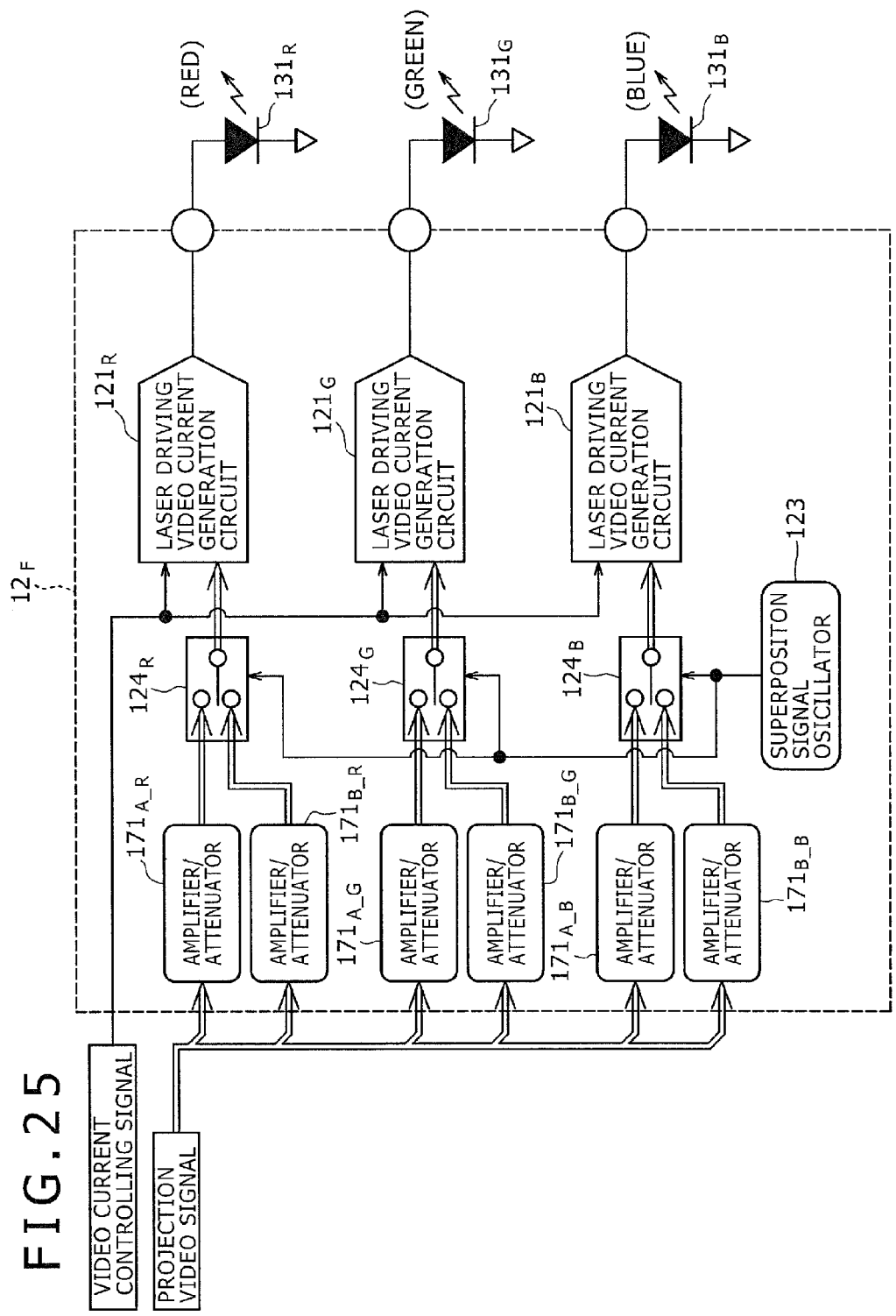
FIG. 25 is a block diagram showing a configuration of a laser driving circuit according to an application example 1 of the first embodiment.

FIG. 25 shows in block diagram a configuration of a laser driving circuit according to an application example 1 of the first embodiment. The laser driving circuit $12_f$ according to the application example 1 is configured such that a plurality of, two in the present example, amplifiers/attenuators $171_A$ and $171_B$ are provided on the input side of each of the laser driving video current generation circuits $121_R$, $121_G$ and $121_B$ in addition to the video signal switches $124_R$, $124_G$ and $124_B$.

Here, functions of the two amplifiers/attenuators $171_{A-R}$ and $171_{B-R}$ and the video signal switch $124_R$ of the red side are described. However, functions of the amplifiers/attenuators $171_{A-G}$ and $171_{B-G}$ and the video signal switch $124_B$ of the green side and functions of the amplifiers/attenuators $171_{A-R}$ and $171_{B-R}$ and the video signal switch $124_R$ of the blue side are similar to those of the amplifiers/attenuators $171_{A-R}$ and $171_{B-R}$ and the video signal switch $124_R$ of the red side, respectively.

The two amplifiers/attenuators $171_{A-R}$ and $171_{B-R}$ have different gains from each other and generate two projection video signals of different amplitudes based on a projection video signal inputted thereto. The two generated projection video signals are used as two inputs to the video signal switch $124_R$. The video signal switch $124_R$ selects or switches the two projection video signals generated by the two amplifiers/attenuators $171_{A-R}$ and $174_{B-R}$ in response to a high frequency signal supplied thereto from the superposition signal oscillator 123.

By the configuration described above, the video signal switch $124_R$ can select two projection video signals of different amplitudes in response to the H/L level of the high frequency signal outputted from the superposition signal oscillator 123. The laser driving video current generation circuit $121_R$ amplifies the projection video signal on which the high frequency signal is superposed to a current value necessary to drive the laser light source $131_R$ and supplies the amplified projection video signal as laser driving current to the laser light source $131_R$. At this time, the laser driving current is supplied as current on which the high frequency signal is superposed to the laser light source $131_R$ and drives the laser light source $131_R$. The amplitude of the high frequency signal to be superposed on the laser driving current can be set arbitrarily depending upon the gain of the two amplifiers/attenuators $171_{A\text{-}R}$ and $171_{B\text{-}R}$.

Also to the superposition signal oscillator 123 in the laser driving circuit $12_f$ according to the present application example 1, the working examples 1 to 4 described hereinabove wherein the emission light waveform of the laser light sources is adjusted in order to maintain the emission light waveform of the laser light sources in a favorable state can be applied. By the application, action and effects achieved by the working examples 1 to 4 can be achieved.

Application Example 2

Figure 26:
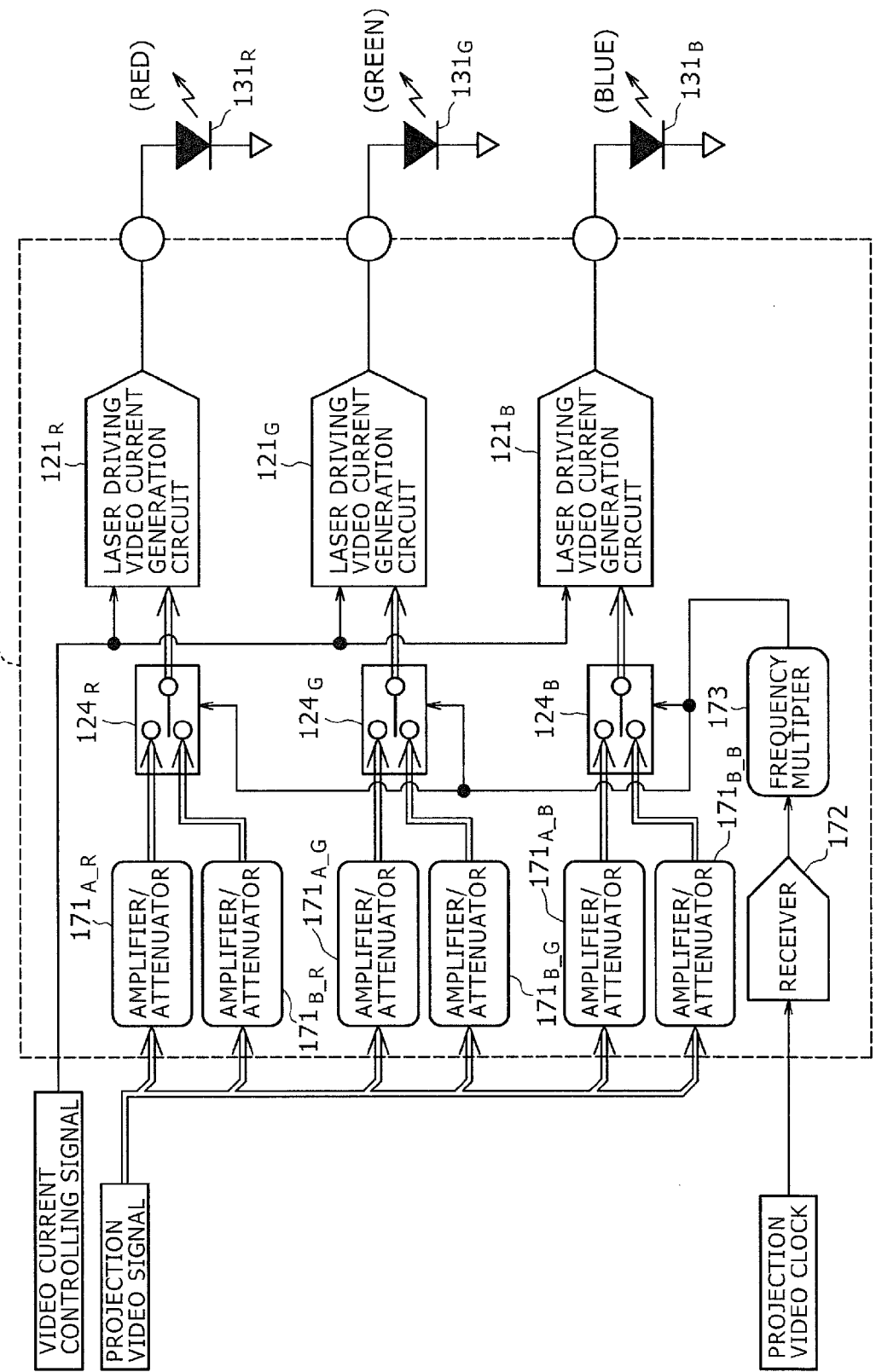
FIG. 26 is a block diagram showing a configuration of a laser driving circuit according to an application example 2 of the first embodiment.

FIG. 26 shows in block diagram a configuration of a laser driving circuit according to an application example 2 of the first embodiment. The laser driving circuit $12_g$ according to the application example 2 is configured such that it uses a receiver 172 in place of the built-in superposition signal oscillator 123 of the laser driving circuit $12_A$ according to the working example 1 and further includes a frequency multiplier 173 at the succeeding stage of the receiver 172.

The receiver 172 receives a projection video clock inputted from the outside, particularly supplied from the video signal processing circuit 11 shown in FIG. 1. The frequency multiplier 173 is configured from a PLL circuit and generates, from a projection video clock generated by the receiver 172, a clock signal having a frequency equal to an integral multiple of the projection video clock and synchronized with the projection video clock as a high frequency signal.

To the laser driving circuit $12_g$ of the configuration wherein it receives a projection video clock by the receiver 172 and multiplies the received projection video clock by the frequency multiplier 173 in this manner, the modification to the working example 1 described hereinabove with reference to FIG. 16 can be applied. In this instance, the receiver 172 which receives the projected video clock inputted from the outside corresponds to the receiver 126 of FIG. 16.

In the case of the laser driving circuit $12_g$ according to the present application example 2, the projection video clock must only be in synchronism with the pixel frequency of the projection video signal, and a high frequency signal of a high frequency which is high in reduction effect of speckle noise can be generated within the laser driving circuit $12_g$ by an action of the frequency multiplier 173. Accordingly, the necessity to generate a projection video clock having a frequency which exhibits a high reduction effect of speckle noise by the video signal processing circuit 11 and transmit the video projection clock from the video signal processing circuit 11 to the laser driving circuit $12_g$, for example, as in the case of the modification to the working example 1 is eliminated.

In the foregoing description, a case is described in which principally the technology of the present disclosure is applied to the laser driving circuit 12 of the configuration wherein a process for superposing a high frequency signal on laser driving current is carried out on the input side of the laser driving video current generation circuits $121_R$, $121_G$ and $121_B$. The technology of the present disclosure can be applied similarly also to the laser driving circuit 12 of another configuration wherein a process for superposing a high frequency signal on laser driving current is carried out on the output side of the laser driving video current generation circuits $121_R$, $121_G$ and $121_B$.

In the following, application to the laser driving circuit 12 of a configuration wherein a process for superposing a high frequency signal on laser driving current is carried out on the output side of the laser driving video current generation circuits $121_R$, $121_G$ and $121_B$ is described.

Application Example 3

Figure 27:
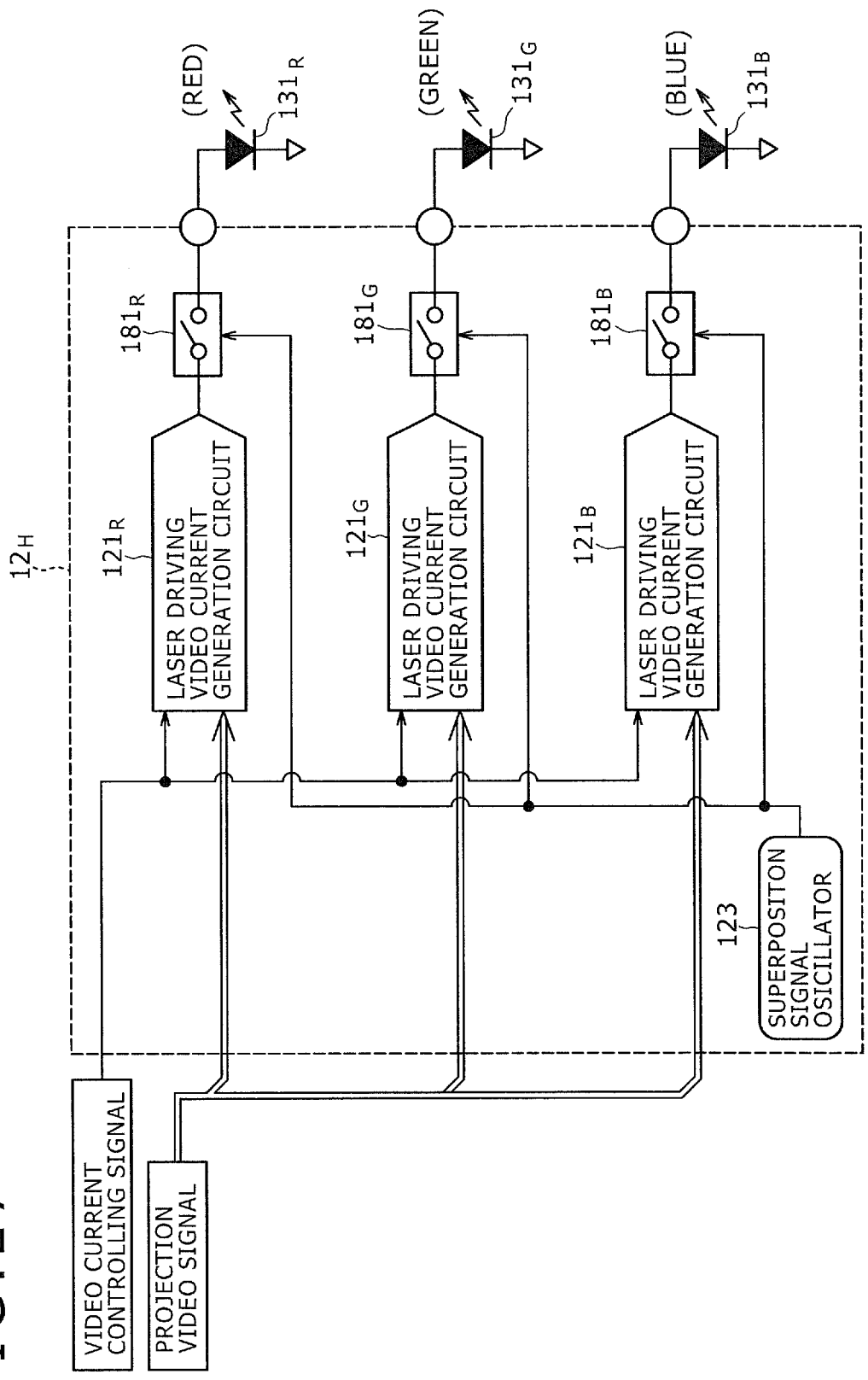
FIG. 27 is a block diagram showing a configuration of a laser driving circuit according to an application example 3 of the first embodiment.

FIG. 27 shows in block diagram a configuration of a laser driving circuit according to an application example 3 of the first embodiment. The laser driving circuit $12_h$ according to the present application example 3 is configured such that it includes, as high frequency superposition sections, laser driving current switches $181_R$, $181_G$ and $181_B$ provided on the output side for each of the laser driving video current generation circuits $121_R$, $121_G$ and $121_B$ in addition to the built-in superposition signal oscillator 123. The laser driving current switches $181_R$, $181_G$ and $181_B$ have a function for selectively passing/intercepting laser driving current generated by the laser driving video current generation circuits $121_R$, $121_G$ and $121_B$.

In the laser driving circuit $12_h$ of the configuration described above, control of passage/interruption of each laser driving current switch 181 is carried out in response to a high frequency signal supplied from superposition signal oscillator 123. By the control, the high frequency signal can be superposed on laser driving current generated by the laser driving video current generation circuits $121_R$, $121_G$ and $121_B$.

In this manner, the working example 1 described hereinabove can be applied to the laser driving circuit $12_h$ wherein high frequency superposition is carried out by an action of the laser driving current switches $181_R$, $181_G$ and $181_B$ on the output side of the laser driving video current generation circuits $121_R$, $121_G$ and $121_B$.

Application Example 4

Figure 28:
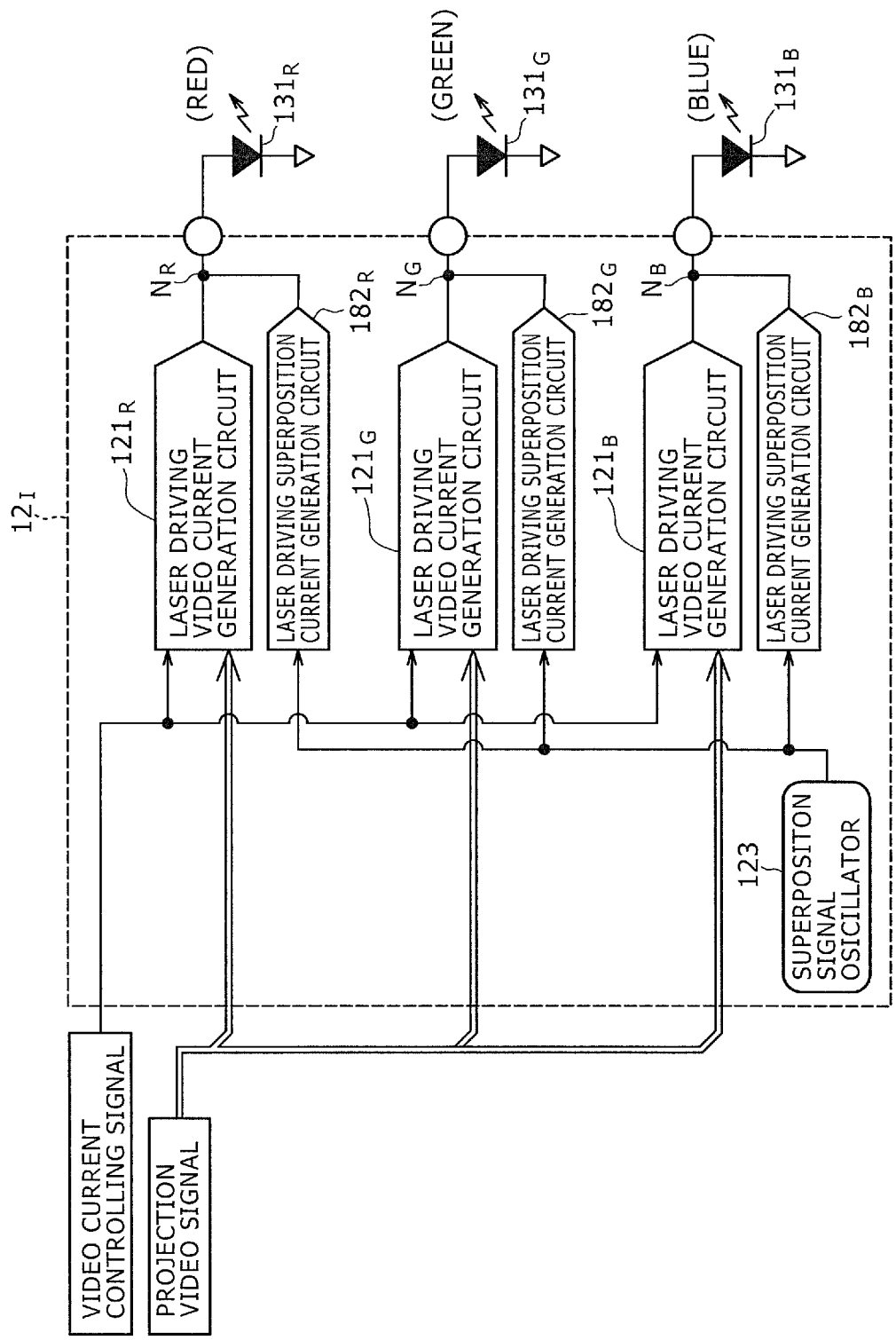
FIG. 28 is a block diagram showing a configuration of a laser driving circuit according to an application example 4 of the first embodiment.

FIG. 28 shows in block diagram a configuration of a laser driving circuit according to an application example 4 of the first embodiment. The laser driving circuit $12_i$ according to the application example 4 is configured such that it includes, as a high frequency superposition section, laser driving superposition current generation circuits $182_R$, $182_G$ and $182_B$ for amplifying a high frequency signal supplied thereto from the superposition signal oscillator 123 in addition to the built-in superposition signal oscillator 123. The laser driving superposition current generation circuits $182_R$, $182_G$ and $182_B$ are connected at an output terminal thereof to connection nodes $N_R$, $N_G$ and $N_B$ on the output side of the laser driving video current generation circuits $121_R$, $121_G$ and $121_B$, respectively.

In the laser driving circuit $12_i$ of the configuration described above, a high frequency signal outputted from the superposition signal oscillator 123 is amplified to a level necessary to drive the laser light sources $131_R$, $131_G$ and $131_B$ by the laser driving superposition current generation circuits $182_R$, $182_G$ and $182_B$. Then, high frequency current outputted from the laser driving superposition current generation circuits $182_R$, $182_G$ and $182_B$ is added to output current of the laser driving video current generation circuits $121_R$, $121_G$ and $121_B$, namely, to laser driving current, at the connection nodes $N_R$, $N_G$ and $N_B$ and then supplied to the laser light sources $131_R$, $131_G$ and $131_B$.

In the case of the laser driving circuit $12_i$ according to the present application example 4, high frequency current of a fixed amplitude is superposed on laser driving current irrespective of the level of the projection video signal. To the laser driving circuit $12_i$, the working example 1 described hereinabove can be applied.

Application Example 5

Figure 29:
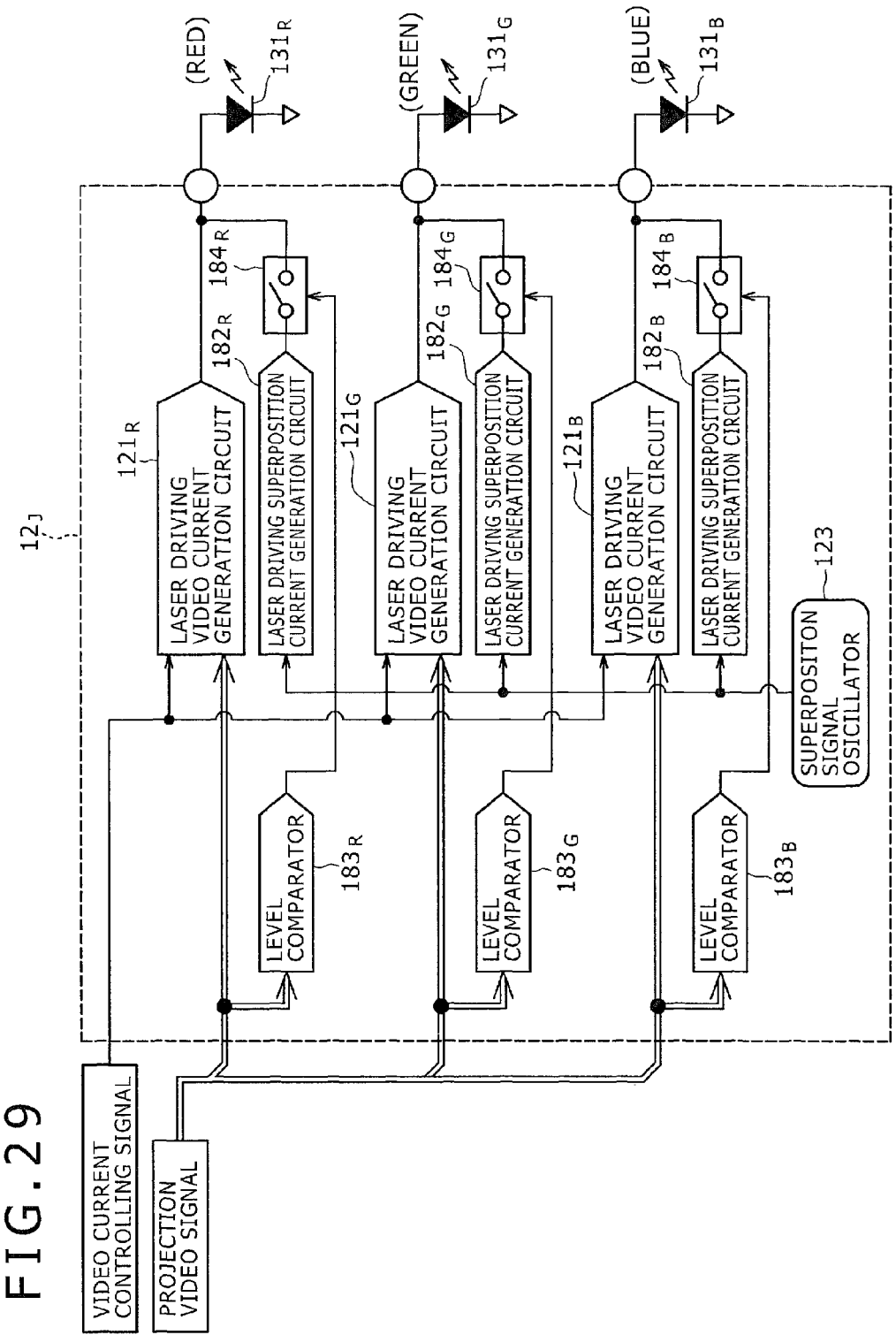
FIG. 29 is a block diagram showing a configuration of a laser driving circuit according to an application example 5 of the first embodiment.

FIG. 29 shows in block diagram a configuration of a laser driving circuit according an application example 5 of the first embodiment. The laser driving circuit $12_j$ according to the present application example 5 is configured such that it includes, as a high frequency superposition section, a level comparator 183 and a superposition current switch 184 for each of the laser driving video current generation circuits $121_R$, $121_G$ and $121_B$ in addition to the built-in superposition signal oscillator 123 and the laser driving superposition current generation circuits 182.

The level comparators 183 ($183_R$, $183_G$ and $183_B$) have a function for deciding whether or not the level of a projection video signal inputted thereto is higher or lower than a predetermined threshold value. The predetermined threshold value is a threshold value for the decision of a projection video signal level and is set to a value close to the zero level of the projection video signal. Here, the "close to the zero level" includes not only some level around the zero level but also the zero level. Upon detection of the zero level of a projection video signal, presence of various dispersions of the predetermined threshold value arising from the design or the fabrication is permitted.

Superposition current switches $184_R$, $184_G$ and $184_B$ are connected between an output terminal of the laser driving superposition current generation circuits $182_R$, $182_G$ and $182_B$ and an output terminal of the laser driving video current generation circuits $121_R$, $121_G$ and $121_B$, respectively. The superposition current switches $184_R$, $184_G$ and $184_B$ carry out on (open)/off (close) operations in response to a result of the comparison, namely, a result of decision, between the laser driving video current generation circuits $121_R$, $121_G$ and $121_B$ and the level comparators $183_R$, $183_G$ and $183_B$, respectively.

In the laser driving circuit $12_j$ of the configuration described above, if the level comparator 183 decides that the level of a video signal exceeds a predetermined threshold value, then the superposition current switch 184 is placed into a conducting or on state in response to a result of the decision. Consequently, high frequency current outputted from the laser driving superposition current generation circuit 182 passes the superposition current switch 184 and is added to or superposed on laser driving current outputted from the laser driving video current generation circuit 121.

To the laser driving circuit $12_j$ according to the present application example 5, the working example 1 described hereinabove can be applied.

Application Example 6

Figure 30:
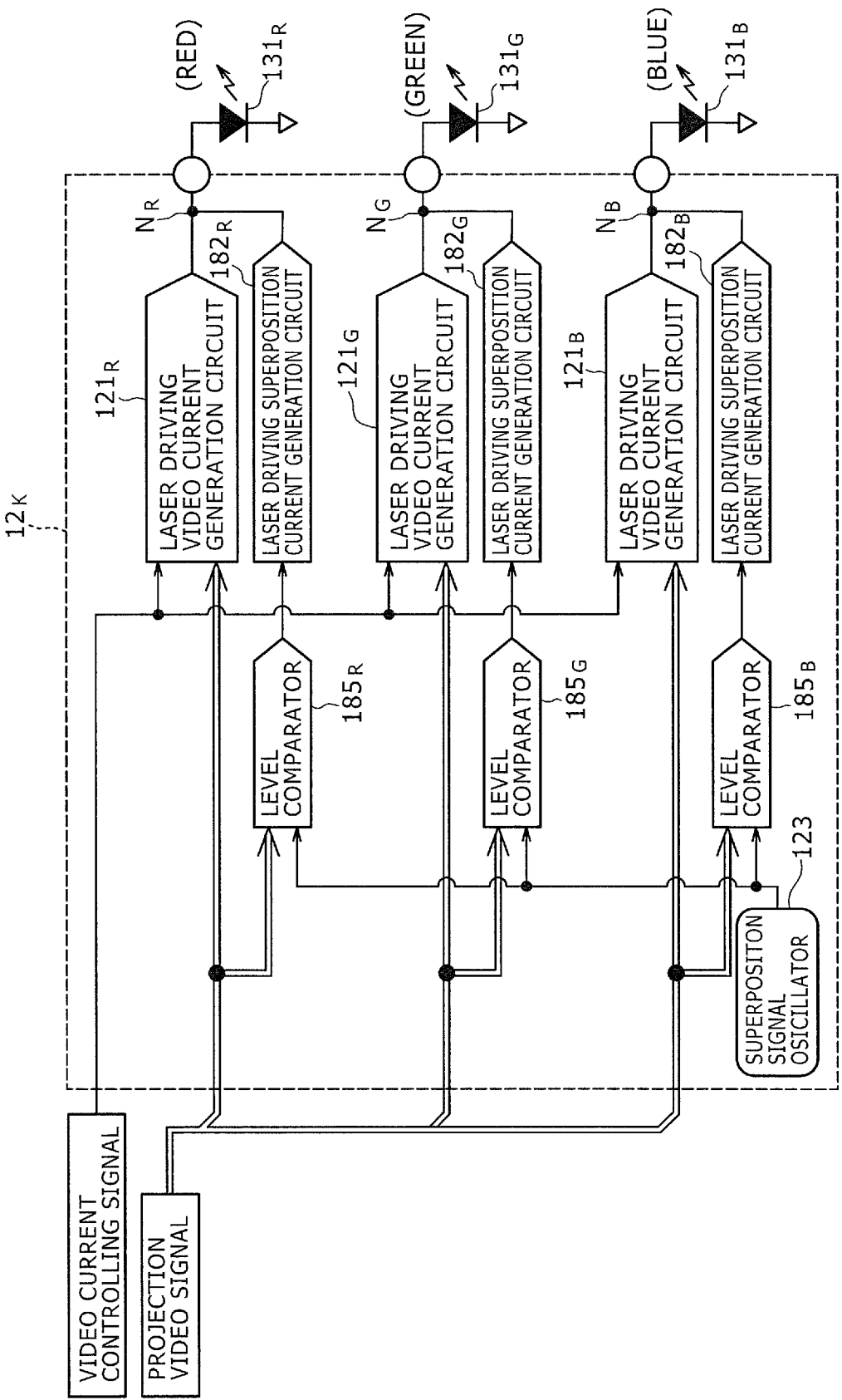
FIG. 30 is a block diagram showing a configuration of a laser driving circuit according to an application example 6 of the first embodiment.

FIG. 30 shows in block diagram a configuration of a laser driving circuit according to an application example 6 of the first embodiment. The laser driving circuit $12_k$ according to the present application example 6 is configured such that it includes multipliers 185, namely, multipliers $185_R$, $185_G$ and $185_B$, for each of the laser driving video current generation circuits $121_R$, $121_G$ and $121_B$ in place of the level comparator 183 and the superposition current switch 184 in the laser driving circuit $12_j$ according to the working example 5.

The multipliers $185_R$, $185_G$ and $185_B$ receive a high frequency signal outputted from the superposition signal oscillator 123 and projection video signals of the different wavelengths as input thereto and multiply them. Output signals of the multipliers $185_R$, $185_G$ and $185_B$ are inputted to the laser driving superposition current generation circuits $182_R$, $182_G$ and $182_B$, respectively. The laser driving superposition current generation circuits $182_R$, $182_G$ and $182_B$ amplify the output signals of the multipliers $185_R$, $185_G$ and $185_B$ to a level necessary for laser driving. Output current of the laser driving superposition current generation circuits $182_R$, $182_G$ and $182_B$ is added to output current of the laser driving video current generation circuits $121_R$, $121_G$ and $121_B$ at the connection nodes $N_R$, $N_G$ and $N_B$, respectively.

Here, the multipliers $185_R$, $185_G$ and $185_B$ and the laser driving superposition current generation circuits $182_R$, $182_G$ and $182_B$ are configured for adjustment of the gain thereof such that, by adjustment of the gain, the amplitude of a high frequency signal to be superposed on laser driving current can be changed. For example, by setting the amplitude of a high frequency signal to be added to a relatively rather low value, the high frequency signal can be superposed with a relatively rather small amplitude on laser driving current. In this instance, also it is possible to configure the multipliers $185_R$, $185_G$ and $185_B$ and the laser driving superposition current generation circuits $182_R$, $182_G$ and $182_B$ such that the gain of both of them can be adjusted or only the gain of the former or the latter can adjusted.

To the laser driving circuit $12_k$ according to the present application example 6, the working example 1 described above can be applied.

<3. System Configuration of the Projector Apparatus According to the Second Embodiment>

As the apparatus of the present disclosure which uses laser light, a projector apparatus of the laser beam scanning type is exemplified similarly as in the case of the first embodiment. In the following, a system configuration of the projector apparatus according to the second embodiment is described.

Figure 31:
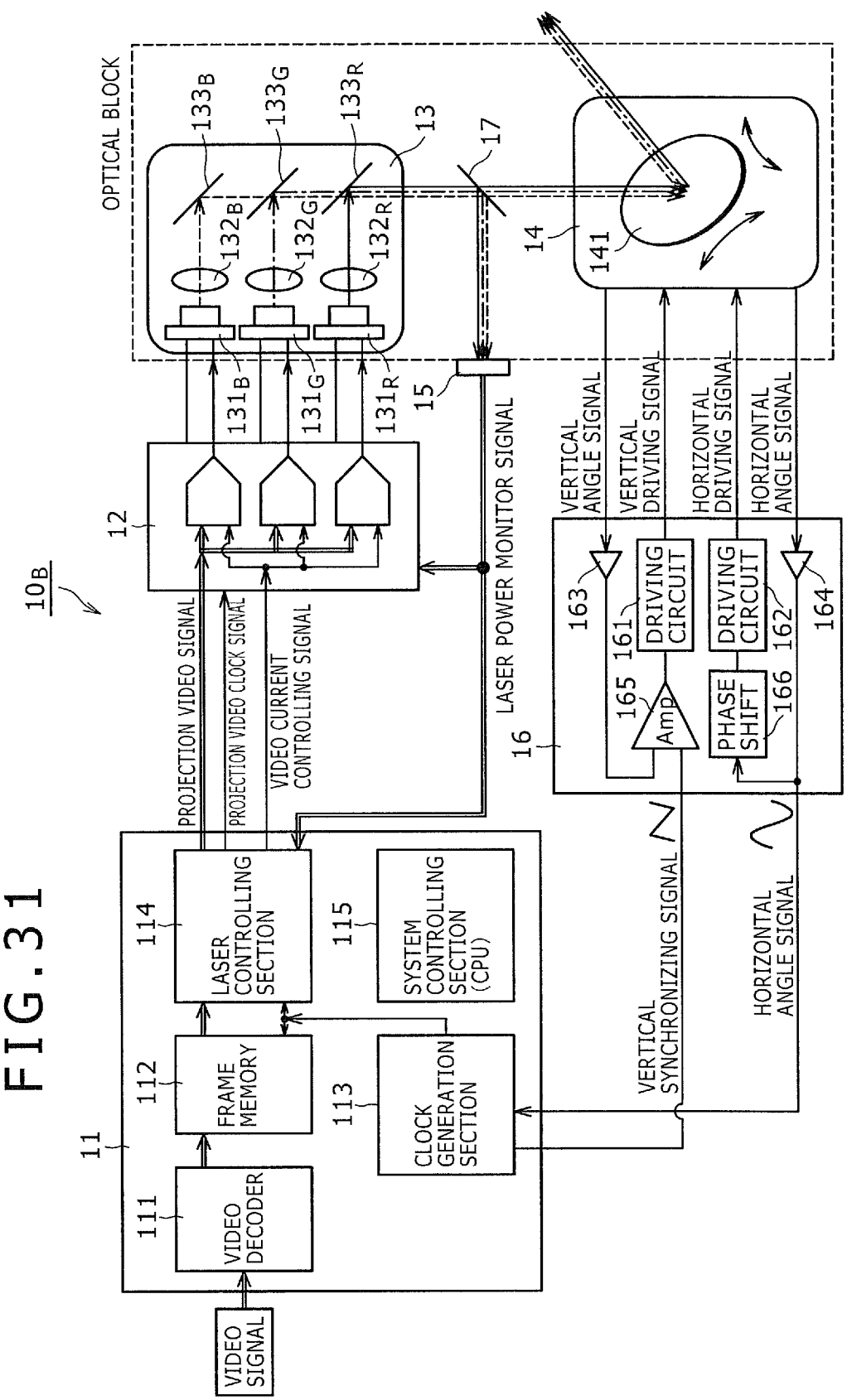
FIG. 31 is a system block diagram showing a configuration of a projector apparatus of the laser beam scanning type according to a second embodiment of the present disclosure.

System Configuration of the Projector Apparatus According to the Second Embodiment FIG. 31 shows in system block diagram an example of a configuration of a projector apparatus of the laser beam scanning type according to the second embodiment. The projector apparatus $10_B$ according to the present embodiment is different from the projector apparatus $10_A$ according to the first embodiment in that it adopts a configuration for feedback control wherein a laser power monitor signal for each wavelength outputted from the light reception element 15 is inputted to a laser driving circuit 12 and the duty is adjusted for each wavelength so that the average emission light power of the emission light waveform is fixed. Therefore, a duty adjustment signal is inputted from the laser controlling section 114 to the laser driving circuit 12 as in the case of the projector apparatus $10_A$ according to the first embodiment.

Here, the light emission delay of a laser light source is fluctuated also by a variation of a state such as the temperature of the laser light source or the degree of degradation although it depends upon the characteristic of the used laser light source. Therefore, by adopting the configuration for feedback control such that the duty of laser driving current is adjusted so that the average emission light power of the emission light waveform may be fixed irrespective of the state of the laser light source during video projection, a stabilized emission light waveform whose duty fluctuation is small can be obtained.

In the following, particular working examples for implementing the feedback control for adjusting the duty for each wavelength so that the average emission light power of the emitted light wave may be fixed are described.

3-1. Working Example 1

Figure 32:
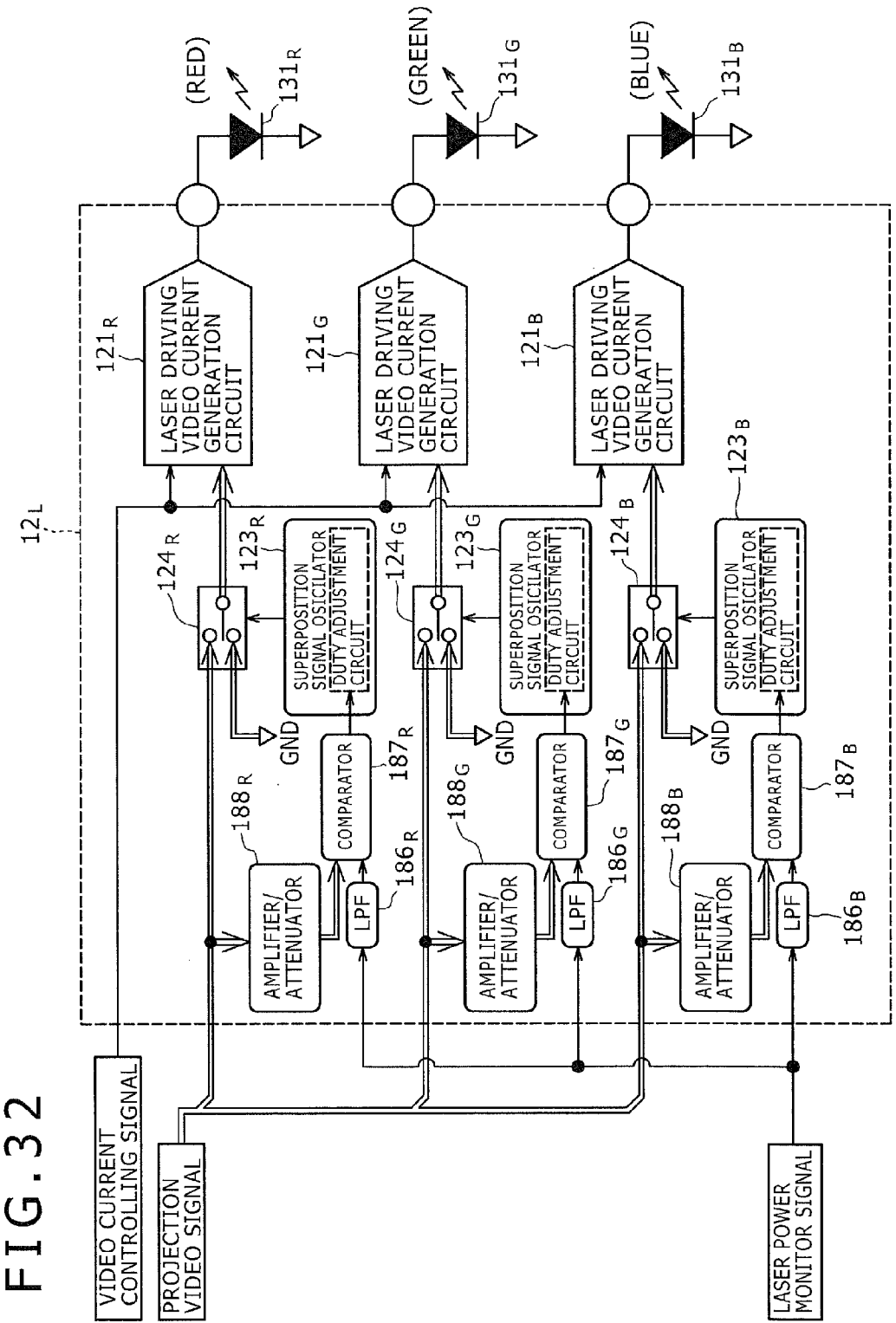
FIG. 32 is a block diagram showing a configuration of a laser driving circuit according to a working example 1 of the second embodiment.

FIG. 32 shows in block diagram a configuration of a laser driving circuit according to a working example 1 of the second embodiment. The laser driving circuit $12_L$ according to the working example 1 includes a superposition signal oscillator 123 for each wavelength, namely, superposition signal oscillators $123_R$, $123_G$ and $123_B$. The superposition signal oscillators $123_R$, $123_G$ and $123_B$ include a duty adjustment circuit. As the duty adjustment circuit, the duty adjustment circuit $125_A$ (refer to FIG. 12) according to the circuit example 1 exemplified in the first embodiment can be used.

The laser driving circuit $12_L$ according to the working example 1 includes, in addition to the superposition signal oscillator 123, a low-pass filter (LPF) 186, a comparator 187 and an amplifier/attenuator 188 for each wavelength. Namely, the laser driving video current generation circuit 121 includes low-pass filters $186_R$, $186_G$ and $186_B$, comparators $187_R$, $187_G$ and $187_B$ and amplifiers/attenuators $188_R$, $188_G$ and $188_B$.

The low-pass filters $186_R$, $186_G$ and $186_B$ remove a high frequency superposition component from a laser power monitor signal for the individual wavelengths to obtain an average power for each pixel. Since the low-pass filters $186_R$, $186_G$ and $186_B$ are provided to remove a high frequency component, if the frequency band of the light reception element 15 is sufficiently low with respect to the high frequency to be superposed, then there is no necessity to provide them.

Figure 33:
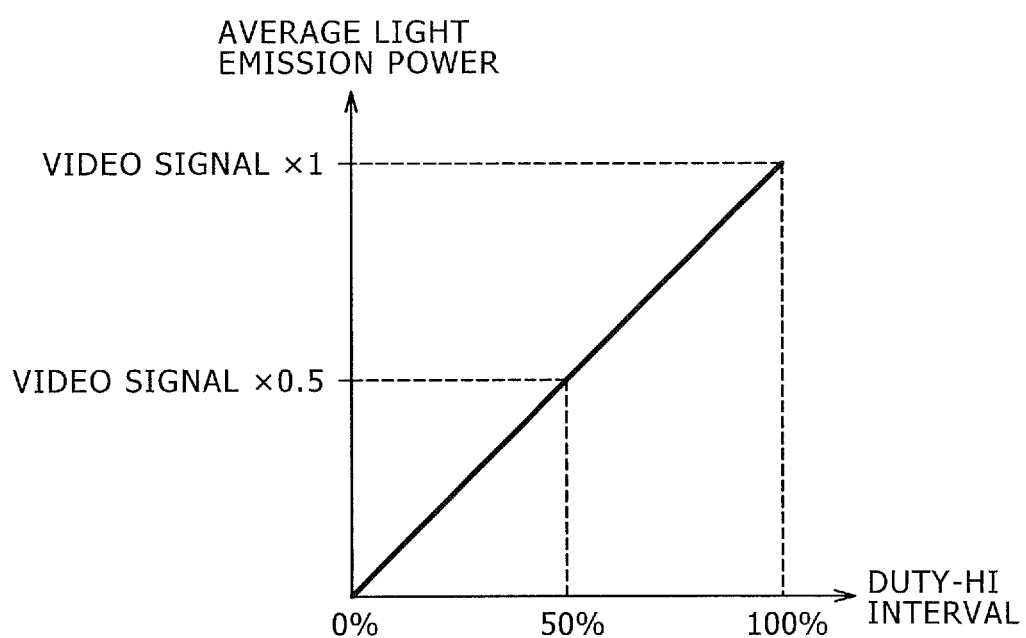
FIG. 33 is a diagram illustrating a relationship between the duty of a superposition emission light waveform and the average emission light power.

The comparators $187_R$, $187_G$ and $187_B$, namely, emission light power signal comparators, compare the power of average emission light power signals supplied thereto through the low-pass filters $186_R$, $186_G$ and $186_B$ and the power of projection video signals supplied thereto through the amplifiers/attenuators $188_R$, $188_G$ and $188_B$ with each other. The gain of the amplifiers/attenuators $188_R$, $188_G$ and $188_B$ is set in response to the duty of the emission light waveform. The duty of a superposition emission light waveform and the average emission light power have such a linear relationship, for example, as illustrated in FIG. 33.

FIG. 34 illustrates a laser emission light waveform generated by the laser driving circuit $12_L$, an average emission light power inputted to the comparator 187 and a waveform of a projection video signal attenuated to 0.5 times. Here, the projection video signal to be inputted to the comparator 187 is attenuated to 0.5 times so that the duty of the emission light waveform becomes 50%. If the average emission light power is lower than that of the amplified/attenuated projection video signal, then the duty is increased, but if conversely the average emission light power is higher, then the duty is decreased as seen in FIG. 34.

In the laser driving circuit $12_L$ according to the working example 1 which adopts the feedback control configuration described above, duty adjustment of laser driving current is carried out so that the average value of the emission light power of the laser light source maintains a fixed ratio to the projection video signal. By adjusting the duty of the laser driving current so that the average emission light power of the emission light waveform may be fixed irrespective of the characteristic of the laser light source, a stabilized emission light waveform whose duty fluctuation is small can be obtained.

3-2. Application Example

The technique of the present second embodiment, namely, the technology for duty adjustment of laser driving current by feedback control, can be applied similarly also to the laser driving circuits described hereinabove in connection with the working examples 1 to 6.

<4. Configuration of the Present Disclosure>

It is to be noted that the present disclosure can adopt such configurations as described below.

[1] A laser driving circuit, including:

a plurality of laser driving video current generation circuits configured to generate a plurality of kinds of laser driving current for driving a plurality of laser light sources configured to emit laser light having wavelengths different from each other based on an inputted video signal;

a high frequency superposition section configured to superpose a high frequency signal having a frequency higher than a frequency band of the video signal on the laser driving current generated by the laser driving video current generation circuits; and a waveform correction section configured to correct a waveform of the high frequency signal.

[2] The laser driving circuit according [1] above, wherein the waveform correction section is configured from a duty adjustment circuit configured to adjust a duty of the high frequency signal.

[3] The laser driving circuit according to [2] above, wherein the high frequency superposition section includes an oscillator configured to oscillate the high frequency signal; and the duty adjustment circuit adjusts the duty of the high frequency signal to be oscillated by the oscillator.

[4] The laser driving circuit according to [2] above, wherein the high frequency superposition section includes, as a signal source of the high frequency signal, a receiver configured to receive a clock signal inputted from the outside in a state in which the clock signal is synchronized with the inputted video signal; and the duty adjustment circuit adjusts the duty of the high frequency signal based on the clock signal received by the receiver.

[5] The laser driving circuit according to any one of [2] to [4] above, wherein the duty adjustment circuit carries out duty adjustment within a range within which an amplitude of the high frequency signal crosses threshold value current of the laser light source.

[6] The laser driving circuit according to [1] above, wherein the waveform correction section includes a plurality of phase and duty adjustment circuits configured to generate a plurality of high frequency signals whose phases and duties are different from each other; and the high frequency superposition section generates multilevel laser driving current within a superposition oscillation period based on the high frequency signals.

[7] The laser driving circuit according to [6] above, wherein the high frequency superposition section has a plurality of switches configured to change over a signal having luminance information and controls the switches in response to the high frequency signals to select a plurality of pieces of luminance information having levels different from each other to generate the multilevel laser driving current.

[8] The laser driving circuit according to [2] above, wherein the high frequency superposition section includes an amplifier/attenuator configured to amplify/attenuate the video signal inputted for each waveform and controls a gain of the amplifier/attenuator in response to an adjustment value of the duty by the duty adjustment circuit.

[9] The laser driving circuit according to [2] above, wherein the high frequency superposition section adjusts the duty of the laser driving current in response to a monitor signal of emission light power of the laser light sources.

[10] The laser driving circuit according to [9] above, wherein the high frequency superposition section includes an amplifier/attenuator configured to amplify/attenuate the inputted video signal and a comparator configured to compare a monitor signal of emission light power of the laser light source and the video signal after passing the amplifier/attenuator with each other; and the duty adjustment circuit adjusts the duty of the laser driving current in response to a result of the comparison by the comparator.

[11] The laser driving circuit according to [10] above, wherein the high frequency superposition section includes a low-pass filter configured to remove a high frequency component of the monitor signal of the emission light power of the laser light source.

[12] A laser driving method, including:
generating a plurality of kinds of laser driving current for driving a plurality of laser light sources configured to emit laser light having wavelengths different from each other based on an inputted video signal;
superposing a high frequency signal having a frequency higher than a frequency band of the video signal on the laser driving current generated by the laser driving current generation; and
correcting a waveform of the high frequency signal.

[13] A projector apparatus, including:
a plurality of laser light sources configured to emit a plurality of kinds of laser light having wavelengths different from each other;
a laser driving circuit configured to drive the laser light sources in response to an inputted video signal; and
a scanner section configured to project the laser light emitted from the laser light sources to a screen; and wherein
the laser driving circuit includes:
a plurality of laser driving video current generation circuits configured to generate a plurality of kinds of laser driving current for driving a plurality of laser light sources configured to emit laser light having wavelengths different from each other based on an inputted video signal;
a high frequency superposition section configured to superpose a high frequency signal having a frequency higher than a frequency band of the video signal on the laser driving current generated by the laser driving video current generation circuits; and
a waveform correction section configured to correct a waveform of the high frequency signal.

[14] An apparatus which uses a laser driving circuit, including:
a plurality of laser driving video current generation circuits configured to generate a plurality of kinds of laser driving current for driving a plurality of laser light sources configured to emit laser light having wavelengths different from each other based on an inputted video signal;
a high frequency superposition section configured to superpose a high frequency signal having a frequency higher than a frequency band of the video signal on the laser driving current generated by the laser driving video current generation circuits; and
a correction section configured to correct a waveform of the high frequency signal.

The present disclosure contains subject matter related to that disclosed in Japanese Priority Patent Application JP 2012-078918 filed in the Japan Patent Office on Mar. 30, 2012, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A laser driving circuit, comprising:
a plurality of current generation circuits configured to generate one or more laser driving currents for driving a plurality of laser light sources configured to emit laser light having wavelengths respectively based on an inputted video signal;
a high frequency superposition section configured to superpose a high frequency signal having a frequency higher than a band of the video signal on the laser driving current generated by the current generation circuits; and
a waveform correction section configured to correct a waveform of the high frequency signal,
wherein the waveform correction section is configured from a duty adjustment circuit configured to adjust a duty of the high frequency signal within a range in which an amplitude of the high frequency signal crosses a respective threshold current of the laser light sources.

2. The laser driving circuit according to claim 1, wherein
the high frequency superposition section includes an oscillator configured to oscillate the high frequency signal; and
the duty adjustment circuit adjusts the duty of the high frequency signal to be oscillated by the oscillator.

3. The laser driving circuit according to claim 1, wherein the high frequency superposition section includes an amplifier/attenuator configured to amplify/attenuate the video signal inputted for each waveform and controls a gain of the amplifier/attenuator in response to an adjustment value of the duty by the duty adjustment circuit.

4. The laser driving circuit according to claim 1, wherein the high frequency superposition section adjusts the duty of the laser driving current in response to a monitor signal of emission light power of the laser light sources.

5. The laser driving circuit according to claim 4, wherein
the high frequency superposition section includes an amplifier/attenuator configured to amplify/attenuate the inputted video signal and a comparator configured to compare a monitor signal of emission light power of the laser light source and the video signal after passing the amplifier/attenuator with each other; and
the duty adjustment circuit adjusts the duty of the laser driving current in response to a result of the comparison by the comparator.

6. The laser driving circuit according to claim 5, wherein the high frequency superposition section includes a low-pass filter configured to remove a high frequency component of the monitor signal of the emission light power of the laser light source.

7. The laser driving circuit according to claim 1, wherein the frequency of the high frequency signal is approximately 200 to 400 MHz.

8. The laser driving circuit according to claim 1, wherein the plurality of laser light sources includes a first laser light source configured to emit red light, a second laser light source configured to emit green light, and a third laser light source configured to emit blue light.

9. A laser driving circuit, comprising:
a plurality of current generation circuits configured to generate one or more laser driving currents for driving a plurality of laser light sources configured to emit laser light having wavelengths respectively based on an inputted video signal;
a high frequency superposition section configured to superpose a high frequency signal having a frequency higher than a band of the video signal on the laser driving current generated by the current generation circuits; and
a waveform correction section configured to correct a waveform of the high frequency signal, wherein
the high frequency superposition section includes, as a signal source of the high frequency signal, a receiver configured to receive a clock signal inputted from the outside in a state in which the clock signal is synchronized with the inputted video signal;

the waveform correction section is configured from a duty adjustment circuit configured to adjust a duty of the high frequency signal; and the duty adjustment circuit adjusts the duty of the high frequency signal based on the clock signal received by the receiver.

10. A laser driving circuit, comprising:

a plurality of current generation circuits configured to generate one or more laser driving currents for driving a plurality of laser light sources configured to emit laser light having wavelengths respectively based on an inputted video signal;

a high frequency superposition section configured to superpose a high frequency signal having a frequency higher than a band of the video signal on the laser driving current generated by the current generation circuits; and a waveform correction section configured to correct a waveform of the high frequency signal, wherein the waveform correction section includes a plurality of phase and duty adjustment circuits configured to generate a plurality of high frequency signals whose phases and duties are different from each other; and the high frequency superposition section generates a multilevel laser driving current within a superposition oscillation period based on the high frequency signals.

11. The laser driving circuit according to claim 10, wherein the high frequency superposition section has a plurality of switches configured to change over a signal having luminance information and controls the switches in response to the high frequency signals to select a plurality of pieces of luminance information having levels different from each other to generate the multilevel laser driving current.

12. The laser driving circuit according to claim 10, wherein the high frequency superposition section includes an oscillator configured to oscillate the high frequency signal; and the phase and duty adjustment circuits adjust the duty of the high frequency signal to be oscillated by the oscillator.

13. A laser driving method, comprising:

generating, by one or more current generation circuits, one or more laser driving currents for driving a plurality of laser light sources configured to emit laser light having wavelengths respectively based on an inputted video signal;

superposing, by a high frequency superposition section, a high frequency signal having a frequency higher than a frequency band of the video signal on the laser driving current generated by the laser driving current generation; and correcting, by a waveform correction section, a waveform of the high frequency signal by adjusting, by a duty adjustment circuit, a duty of the high frequency signal within a range in which an amplitude of the high frequency signal crosses a respective threshold current of the laser light sources.

14. The laser driving method according to claim 13, wherein superposing the high frequency signal includes oscillating the high frequency signal; and correcting the waveform of the high frequency signal includes adjusting the duty of the high frequency signal to be oscillated.

15. A projector apparatus, comprising:

a plurality of laser light sources configured to emit a plurality of kinds of laser light having respective wavelengths based on an inputted video signal;

a laser driving circuit configured to drive the laser light sources in response to the inputted video signal; and a scanner section configured to project the laser light emitted from the laser light sources to a screen;

wherein the laser driving circuit includes a plurality of current generation circuits configured to generate one or more laser driving currents for driving the plurality of laser light sources, a high frequency superposition section configured to superpose a high frequency signal having a frequency higher than a band of the video signal on the laser driving current generated by the current generation circuits, and a waveform correction section configured to correct a waveform of the high frequency signal, wherein the waveform correction section is configured from a duty adjustment circuit configured to adjust a duty of the high frequency signal within a range in which an amplitude of the high frequency signal crosses a respective threshold current of the laser light sources.

16. The projector apparatus according to claim 15, wherein the high frequency superposition section includes an oscillator configured to oscillate the high frequency signal; and the waveform correction section adjusts the duty of the high frequency signal to be oscillated by the oscillator.

17. An apparatus which uses a laser driving circuit, comprising:

a plurality of current generation circuits configured to generate one or more laser driving currents for driving a plurality of laser light sources configured to emit laser light having wavelengths respectively based on an inputted video signal;

a high frequency superposition section configured to superpose a high frequency signal having a frequency higher than a band of the video signal on the laser driving current generated by the current generation circuits; and a correction section configured to correct a waveform of the high frequency signal, wherein the correction section is configured from a duty adjustment circuit configured to adjust a duty of the high frequency signal within a range in which an amplitude of the high frequency signal crosses a respective threshold current of the laser light sources.

18. The apparatus according to claim 17, wherein the high frequency superposition section includes an oscillator configured to oscillate the high frequency signal; and the correction section adjusts the duty of the high frequency signal to be oscillated by the oscillator.

* * * * *